(12) United States Patent
Hsieh

(10) Patent No.: US 8,373,224 B2
(45) Date of Patent: Feb. 12, 2013

(54) SUPER-JUNCTION TRENCH MOSFET WITH RESURF STEPPED OXIDES AND TRENCHED CONTACTS

(75) Inventor: Fu-Yuan Hsieh, New Taipei (TW)

(73) Assignee: Force Mos Technology Co., Ltd. (TW)

( * ) Notice: Subject to any disclaimer, the term of this patent is extended or adjusted under 35 U.S.C. 154(b) by 0 days.

(21) Appl. No.: 13/291,442

(22) Filed: Nov. 8, 2011

(65) Prior Publication Data
US 2012/0074489 A1    Mar. 29, 2012

Related U.S. Application Data

(63) Continuation-in-part of application No. 12/654,637, filed on Dec. 28, 2009, now Pat. No. 8,067,800.

(51) Int. Cl.
*H01L 29/78* (2006.01)

(52) U.S. Cl. .................. 257/330; 257/E29.262
(58) Field of Classification Search .................. 257/330, 257/331, E21.41, E29.262, E29.256
See application file for complete search history.

(56) References Cited

U.S. PATENT DOCUMENTS 8,067,800 B2 * 11/2011 Hsieh ............................ 257/331

* cited by examiner

*Primary Examiner* — Calvin Lee
*Assistant Examiner* — Monica D Harrison
(74) *Attorney, Agent, or Firm* — Bacon & Thomas, PLLC

(57) ABSTRACT

A super-junction trench MOSFET with Resurf Stepped Oxide and trenched contacts is disclosed. The inventive structure can apply additional freedom for better optimization and manufacturing capability by tuning thick oxide thickness to minimize influence of charge imbalance, trapped charges, etc. . . . Furthermore, the fabrication method can be implemented more reliably with lower cost.

24 Claims, 27 Drawing Sheets

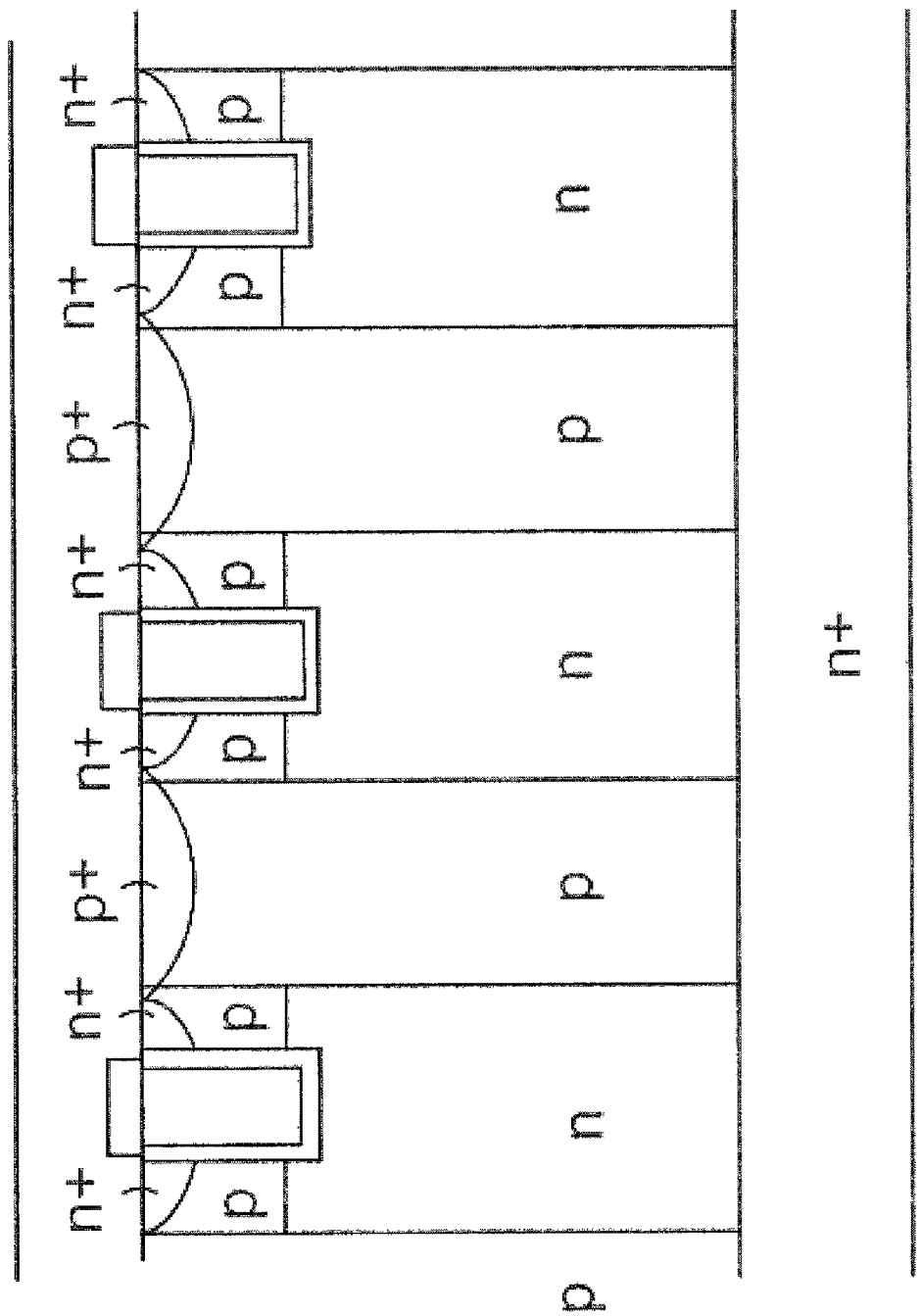

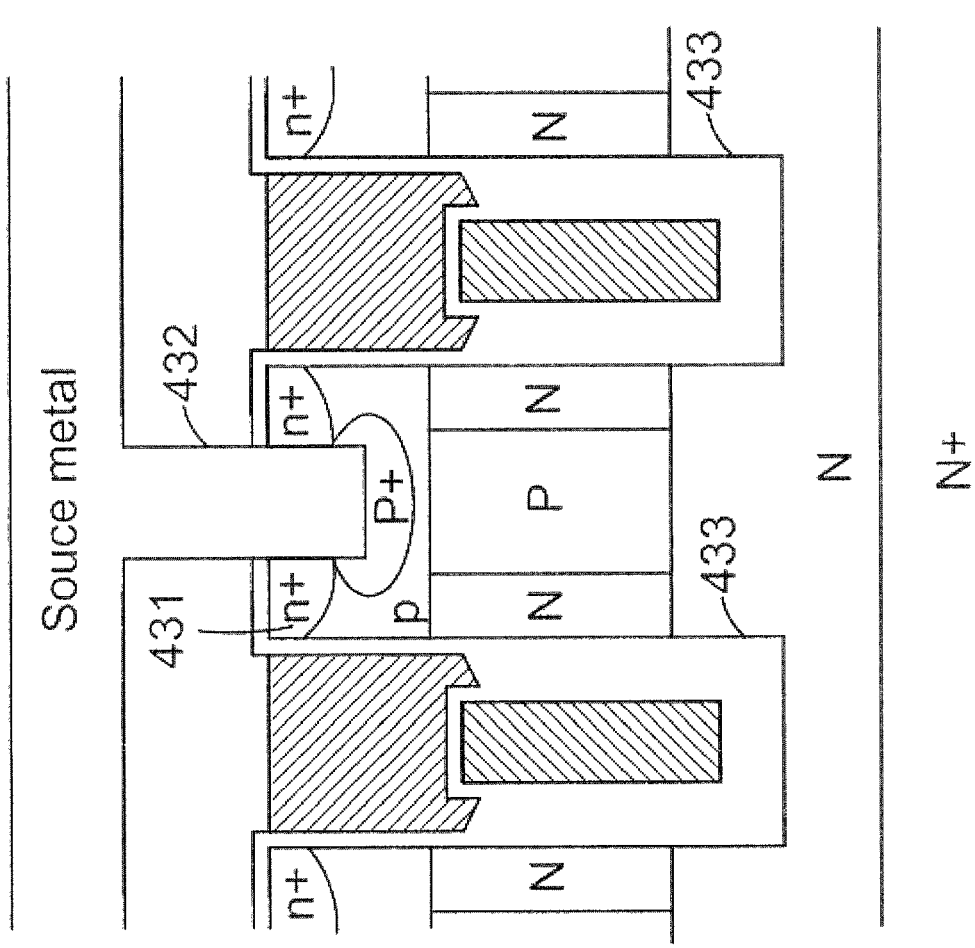

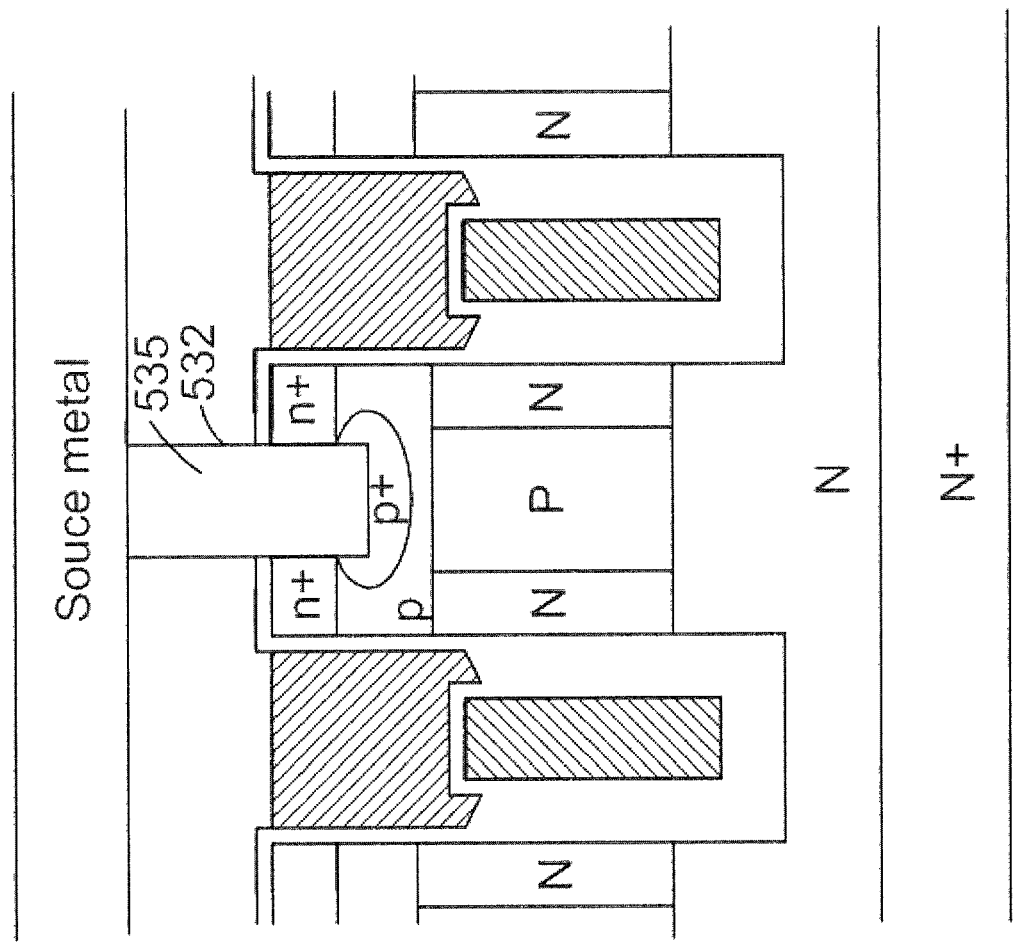

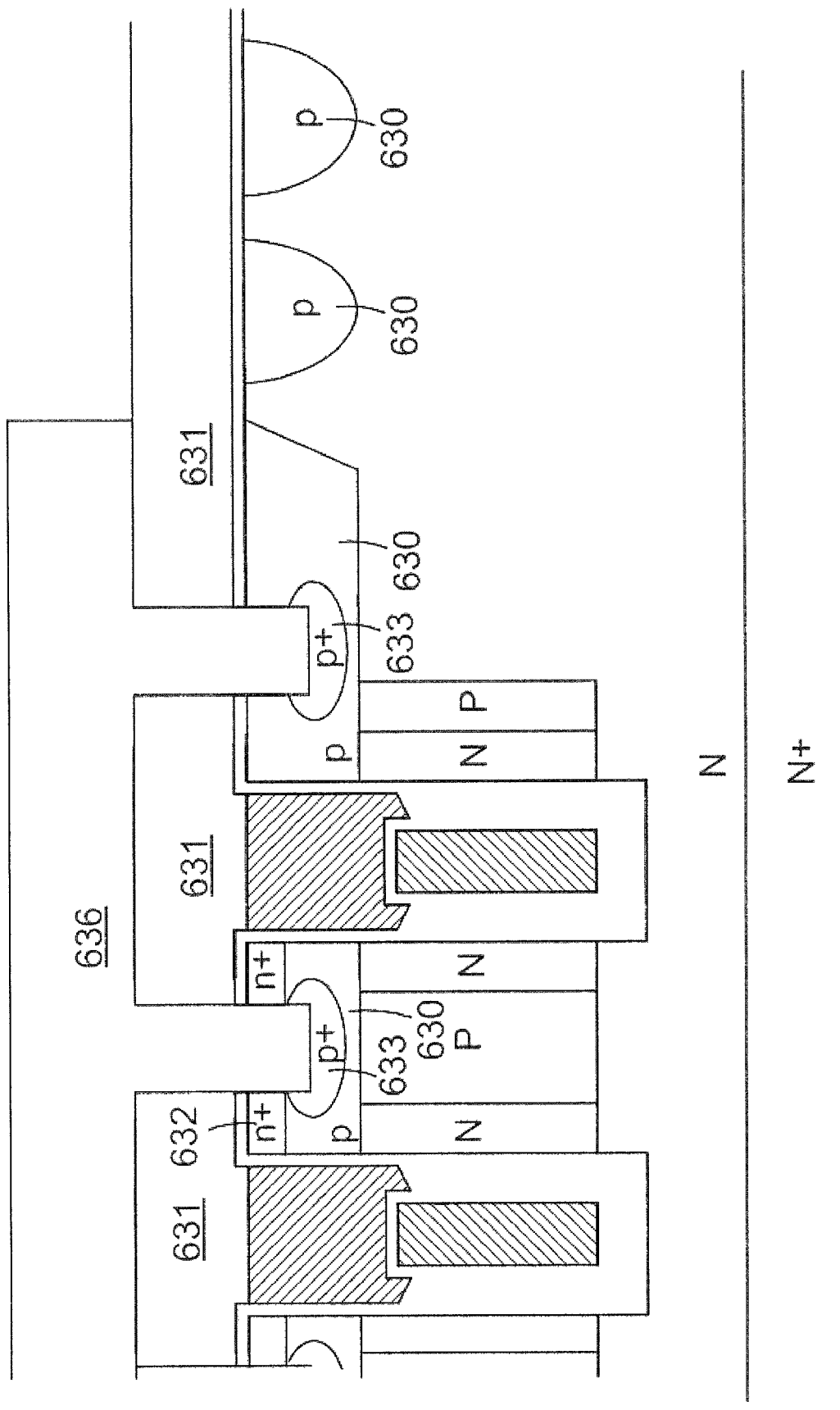

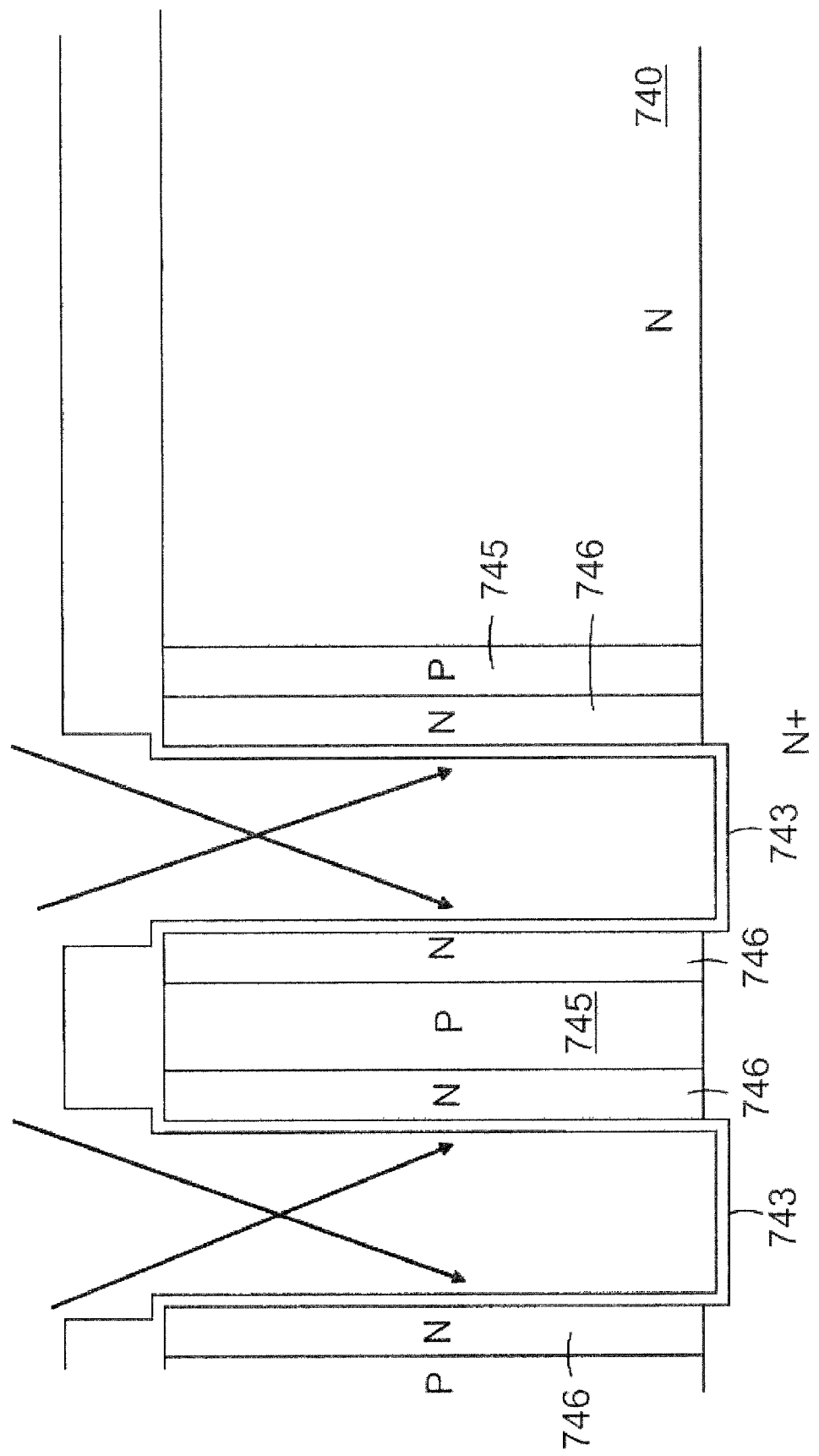

SUPER-JUNCTION TRENCH MOSFET WITH RESURF STEPPED OXIDES AND TRENCHED CONTACTS

CROSS-REFERENCE TO RELATED APPLICATION

This application is a Continuation-In-Part of U.S. patent application Ser. No. 12/654,637 of the same inventor, filed on Dec. 28, 2009 entitled "super-junction trenched MOSFET with Resurf Step Oxide and the method to make the same".

FIELD OF THE INVENTION

This invention relates generally to the cell structure, device configuration and fabrication process of power semiconductor devices. More particularly, this invention relates to a novel and improved cell structure, device configuration and improved fabrication process of a super-junction MOSFET (Metal Oxide Semiconductor Field Effect Transistor).

BACKGROUND OF THE INVENTION

Compared to the conventional trench MOSFET, the super-junction trench MOSFET are more attractive due to its higher breakdown voltage and lower specific Rds (drain-source resistance). As is known to all, the super-junction trench MOSFET is implemented by a p type column structure and an n type column structure arranged in parallel and connecting to each other onto a heavily doped substrate, however, the manufacturing yield is not stable because it is very sensitive to the fabrication processes and conditions such as: the p type column structure and the n type column structure dopant re-diffusion issue induced by subsequent thermal processes, trapped charges within the column structures, etc. . . . All that will cause a hazardous condition of charges imbalance to the super-junction trench MOSFET. More specifically, these undesired influences become more pronounced with a narrower column structure width for a lower bias voltage ranging under 200V.

U.S. Pat. No. 7,601,597 disclosed a method to avoid the aforementioned p type column structure and the n type structure dopant re-diffusion issue, for example in an N-channel trench MOSFET, by setting up the p type column formation process at a last step after all diffusion processes such as: sacrificial oxidation after trench etch, gate oxidation, P body region formation and n+ source region formation, etc. . . . have been finished. The disclosed super-junction trench MOSFET is shown in FIG. 1A.

However, the disclosed method is not cost effective because that, first, the p type column structure is formed by growing an additional p type epitaxial layer after etching deep trenches; second, an additional CMP (Chemical Mechanical Polishing) is required for surface planarization after the p type epitaxial layer is grown; third, double trench etches are necessary (one for shallow trenches for trenched gates formation and another for the deep trenches for the p type column structure formation), all the increased cost is not conductive to mass production. Moreover, other factors such as: the charges imbalance caused by the trapped charges within the column structures is still not resolved.

Prior arts (paper "Industrialization of Resurf Stepped Oxide Technology for Power Transistors", by M. A. Gajda, etc., and paper "Tunable Oxide-Bypassed Trench Gate MOSFET Breaking the Ideal Super-junction MOSFET Performance Line at Equal Column Width", by Xin Yang, etc.) disclosed device structures in order to resolve the limitation caused by the conventional super-junction trench MOSFET discussed above, as shown in FIG. 1B and FIG. 1C. Except for different terminologies (the device structure in FIG. 1B named with RSO: Resurf Stepped Oxide and the device structure in FIG. 1V named with TOB: Tunable Oxide-Bypassed), both device structures in FIG. 1B and FIG. 1C are basically the same which can achieve a lower specific Rds and a higher breakdown voltage than the conventional super-junction trench MOSFET because the epitaxial layer (epi, as illustrated in FIG. 1B and FIG. 1C) has a higher doping concentration than the conventional super-junction trench MOSFET.

Refer to FIG. 1B and FIG. 1C again, both the device structures have a deep trench with a thick oxide layer along trench sidewalls and bottom into a drift region. Only difference is that, the device structure in FIG. 1B has a single epitaxial layer (N epi, as illustrated in FIG. 1B) while the device structure in FIG. 1C has double epitaxial layers (Epi1 and Epi2, as illustrated in FIG. 1C, Epi1 supported on a heavily doped substrate has a lower doping concentration than Epi2 near a channel region). Due to the p type column structure and the n type column structure interdiffusion, both the device structures in FIG. 1B and FIG. 1C do not have charges imbalance issue, resolving the technical limitation caused by the conventional super-junction trench MOSFET, however, the benefit of both the device structures in FIG. 1B and FIG. 1C over the conventional super-junction trench MOSFET only pronounces at the bias voltage ranging under 200V, which means that, the conventional super-junction trench MOSFET has a lower Rds when the bias voltage is beyond 200V.

Therefore, there is still a need in the art of the semiconductor power device, particularly for super-junction trench MOSFET design and fabrication, to provide a novel cell structure, device configuration and fabrication process that would resolve these difficulties and design limitations.

SUMMARY OF THE INVENTION

The present invention provides a super-junction trench MOSFET with resurf stepped oxides (RSO) having additional freedom for better performance optimization and manufacturing capability by tuning a thick oxide thickness to minimize influence of the charges imbalance, trapped charges, etc. Therefore, the present invention only requires one kind trenches and a single epitaxial layer to achieve a better cost effective than the prior arts. Moreover, the present invention also provides trenched contact in a super-junction trench MOSFET for better device shrinkage.

In one aspect, the present invention features a super-junction trench MOSFET with resurf stepped oxides and split gates with a buried source electrode comprising: a substrate of a first conductivity type; an epitaxial layer of the first conductivity type onto the substrate, wherein the epitaxial layer has a lower doping concentration than the substrate; a plurality of trenches starting from an upper surface of the epitaxial layer and extending downward into the epitaxial layer; a first insulation layer along an inner surface of a lower portion of each of the trenches; a source electrode within the lower portion of each of the trenches and surrounded by the first insulation layer; a second insulation layer along an inner surface of an upper portion of each of the trenches and covering a top surface of the first insulation layer and the source electrode, wherein the second insulation layer has a thinner thickness than the first insulation layer; a gate electrode within the upper portion of each of the trenches and surrounded by the second insulation layer; a plurality of first doped column regions of the first conductivity type with column shape within the epitaxial layer, formed adjacent to sidewalls of the trenches and having column bottoms above trench bottoms of the trenches; a plurality of second doped column regions of a second conductivity type with column shape within the epitaxial layer, formed in parallel between two adjacent said first doped column regions; a body region of the second conductivity type within the epitaxial layer, formed adjacent to sidewalls of the upper portion of the trenches and onto a top surface of the first doped column regions and the second doped column regions between every two adjacent of the trenches; and a source region of the first conductivity type formed near a top surface of the body region in an active area and surrounding the trenches, wherein the source region has a higher doping concentration than the epitaxial layer. In some preferred embodiment, the present invention further comprises a trenched source-body contact filled with a contact metal plug and penetrating through the source region and extending into the body region.

In another aspect, the present invention features a super junction trench MOSFET with resurf stepped oxides and single gate electrode comprising: a substrate of a first conductivity type; an epitaxial layer of the first conductivity type onto the substrate, wherein the epitaxial layer has a lower doping concentration than the substrate; a plurality of trenches starting from an upper surface of the epitaxial layer and extending downward into the epitaxial layer; a first insulation layer along an inner surface of a lower portion of each of the trenches; a second insulation layer along an inner surface of an upper portion of each of the trenches, wherein the second insulation layer has a thinner thickness than the first insulation layer; a single gate electrode within each of the trenches, surrounded by the first insulation layer and the second insulation layer; a plurality of first doped column regions of the first conductivity type within the epitaxial layer, formed adjacent to sidewalls of the trenches and having column bottoms above trench bottoms of the trenches; a plurality of second doped column regions of a second conductivity type within the epitaxial layer, formed in parallel between the first doped column regions; a body region of the second conductivity type within the epitaxial layer, formed adjacent to sidewalls of the upper portion of the trenches and onto a top surface of the first doped column regions and the second doped column regions between every two adjacent of the trenches, and a source region of the first conductivity type formed near a top surface of the body region in an active area and surrounding the trenches, wherein the source region has a higher doping concentration than the epitaxial layer. In some preferred embodiment, the present invention further comprises a trenched source-body contact filled with a contact metal plug and penetrating through the source region and extending into the body region.

Preferred embodiments include one or more of the following features: the trench bottoms of the trenches are above the substrate; the trenches further extend into the substrate; the present invention further comprises an avalanche enhancement doped region of the second conductivity type within the body region and below the source region, wherein the avalanche enhancement doped region is formed between a pair of the source regions and having a higher doping concentration than the body region; the present invention further comprises a shallow contact doped region of the second conductivity type near the top surface of the body region, wherein the shallow contact doped region is formed between a pair of the source regions and onto the avalanche enhancement doped region, wherein the shallow contact doped region has a higher doping concentration than the avalanche enhancement doped region; the present invention further comprises a body contact doped region within the body region and surrounding at least bottom of the trenched source-body contact underneath the source region, wherein the body contact doped region has a higher doping concentration than the body region; the present invention further comprises a guard ring in a termination area when the breakdown voltage is less than or equal to 100V; the present invention further comprises a guard ring and multiple floating rings in a termination area when the breakdown voltage is larger than 100V; the present invention further comprises a source metal onto a contact interlayer and connected to the source region and the body region by the trenched source-body contact; the present invention further comprises a source metal onto a contact interlayer and penetrating through the contact interlayer to contact with the shallow contact doped region and the source region in the active area or only contact to the shallow contact doped region near the termination area; the source region is formed by later diffusion and has a higher doping concentration and a greater junction depth along sidewalls of the trenched source-body contact than along a channel region near the trenches, and the source region has a doping profile of Gaussian-distribution from the sidewalls of the trenched source-body contact to the channel region; the contact metal plug is a tungsten layer padded by a barrier metal layer of Ti/TiN or Co/TiN; the contact metal plug is a source metal layer such as Al alloys padded with Ti/TiN or Co/TiN.

The invention also features a method of making a super-junction trench MOSFET, comprising: (a) growing an epitaxial layer of a first conductivity type upon a heavily doped substrate of a first conductivity type; (b) applying a trench mask to form a plurality of trenches extending into the epitaxial layer or through the epitaxial layer and into the substrate; (c) growing a screen oxide along an inner surface of the trenches; (d) carrying out angle Ion Implantation of a second conductivity type dopant and diffusion to form second doped column regions between two adjacent of the trenches; (e) carrying out angle Ion Implantation of the first conductivity type dopant and diffusion to form first doped column regions adjacent to sidewalls of the trenches and in parallel surrounding the second doped column regions; (f) forming a first insulation layer along the inner surface of the trenches by thermal oxide growth or oxide deposition; (g) depositing a doped poly-silicon layer filling each of the trenches and close to the first insulation layer to serving as a source electrode; (h) etching back the source electrode and the first insulation layer from an upper portion of the trenches; (i) growing a second insulation layer along the upper sidewalls of each of the trenches and onto a top surface of the source electrode and the first insulation layer, wherein the second insulation layer has a thinner thickness than the first insulation layer; (j) depositing another doped poly-silicon layer filling the upper portion of each of the trenches and close to the second insulation layer to serve as a gate electrode; (k) etching back the gate electrode by CMP (Chemical Mechanical Polishing) or Plasma Etch; (l) applying a body mask onto a top surface of the epitaxial layer; (m) carrying out Ion implantation of the second conductivity type dopant and diffusion to form a body region; (n) removing the body mask and applying a source mask onto top surface of the epitaxial layer; (o) carrying out Ion Implantation of the first conductivity type dopant and diffusion to form a source region; (p) removing the source mask and depositing a contact interlayer onto a top surface of the epitaxial layer; and (q) applying a contact mask and etching a contact trench penetrating the contact interlayer, the source region and extending into the body region.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 1A is a cross-sectional view of a super-junction trench MOSFET of prior art.

FIG. 4C is a cross-sectional view of another preferred embodiment according to the present invention.

FIG. 4D is a cross-sectional view of another preferred embodiment according to the present invention.

FIG. 5A is a cross-sectional view of another preferred embodiment according to the present invention.

FIGS. 7A-7G are a serial of side cross-sectional views for showing the processing steps for fabricating the super-junction trench MOSFET as shown in FIG. 5D.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1B:
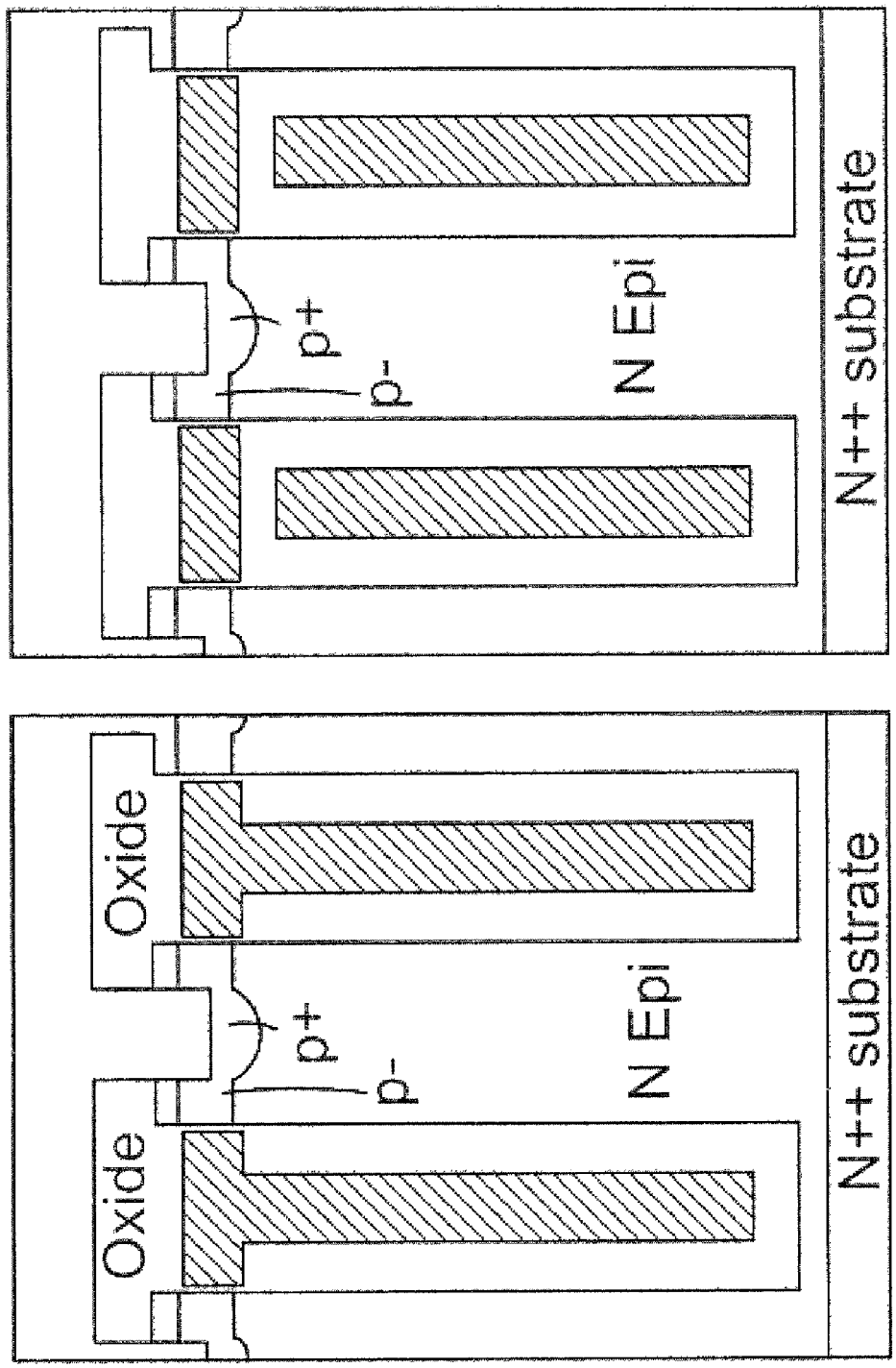
FIG. 1B is a cross-sectional view of a trench MOSFET of another prior art.
Figure 1C:
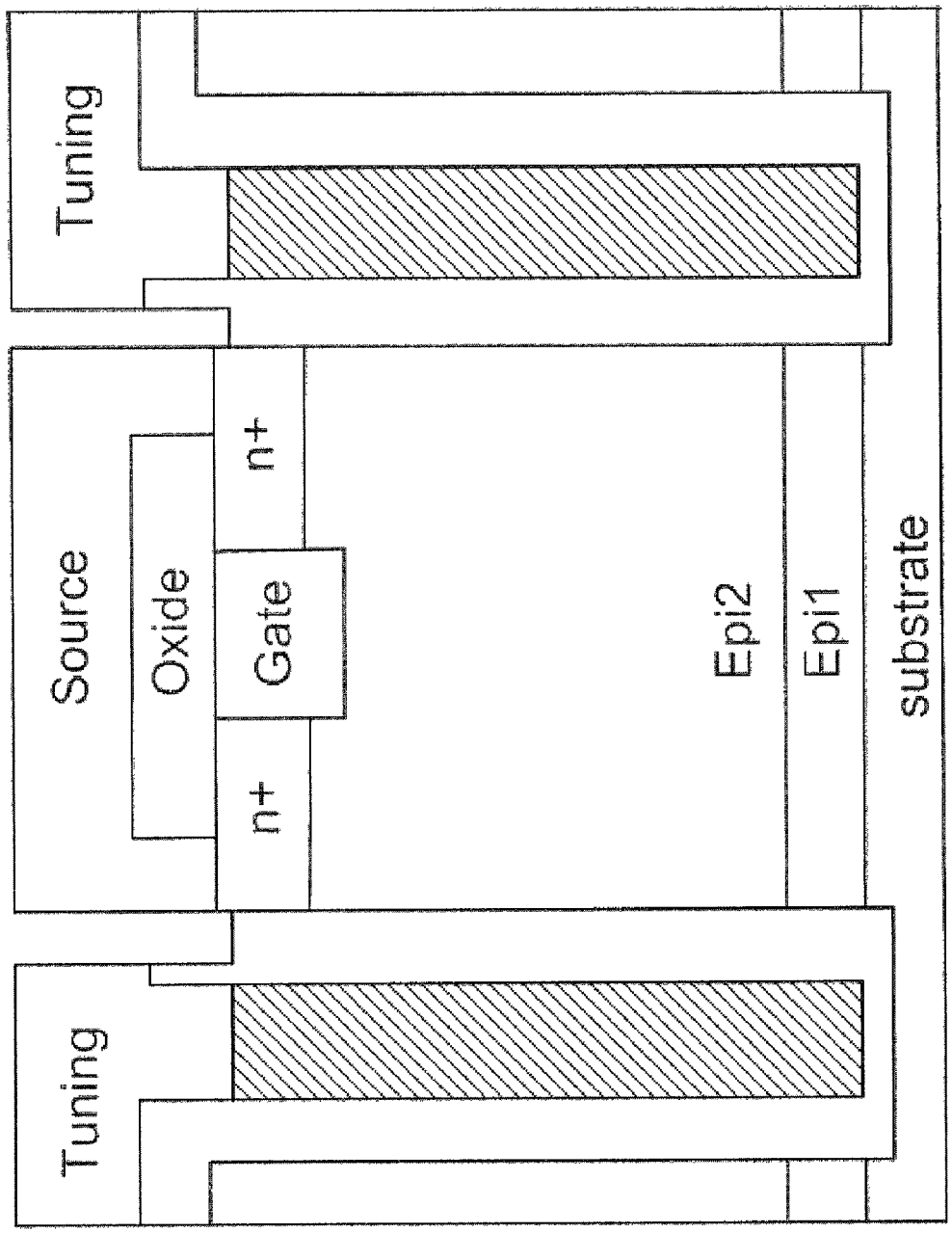
FIG. 1C is a cross-sectional view of a trench MOSFET of another prior art.
Figure 2A:
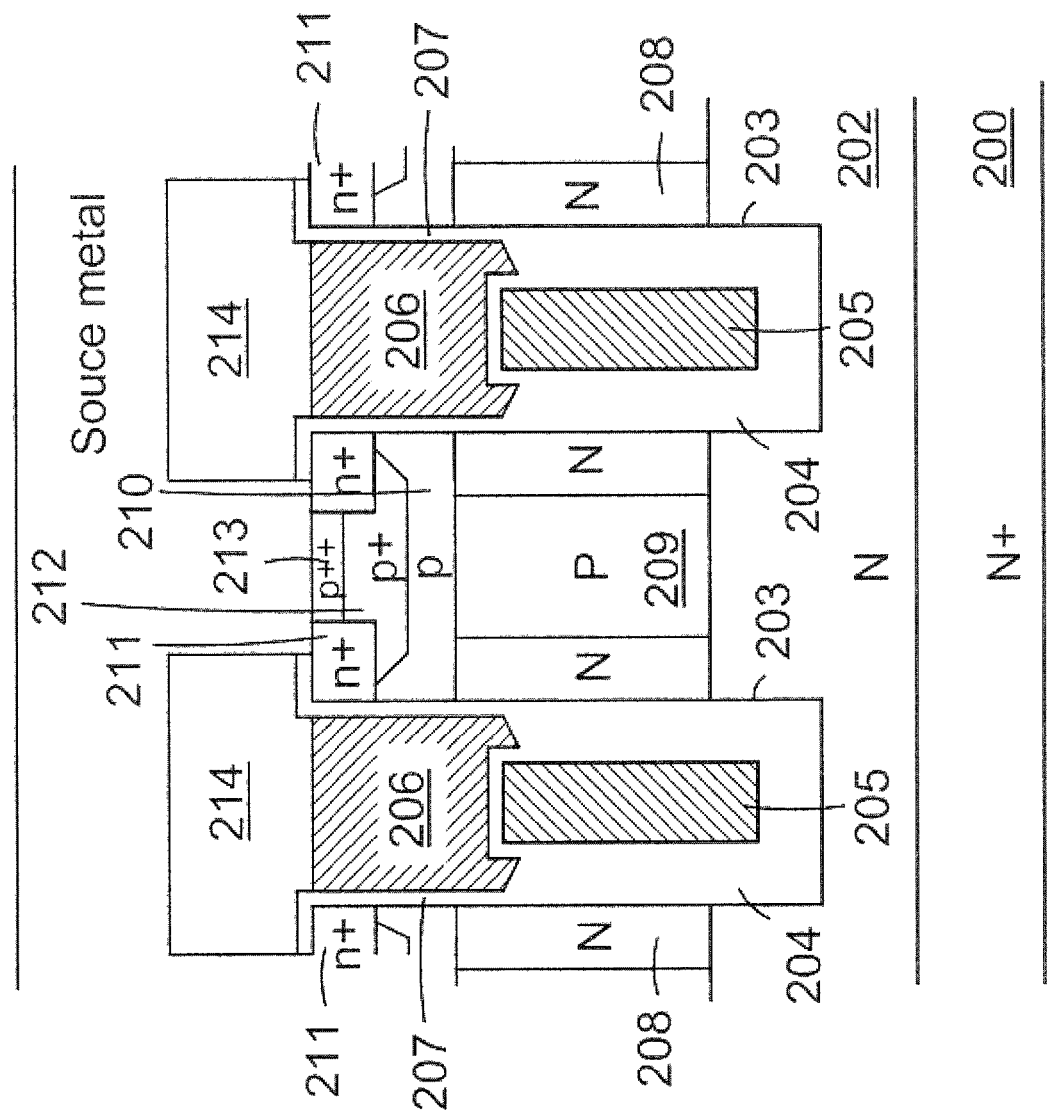
FIG. 2A is a cross-sectional view of a preferred embodiment according to the present invention.

Please refer to FIG. 2A for a preferred embodiment of this invention where an N-channel super-junction trench MOSFET is formed in an N epitaxial layer 202 onto an N+ substrate 200. A plurality of trenches 203 are formed starting from an upper surface of the N epitaxial layer 202 and vertically down extending, not reaching the interface of the N+ substrate 200 and the N epitaxial layer 202. Into each of the trenches 203, a doped poly-silicon layer is deposited filling a lower portion of the trench 203 to serve as a source electrode 205 padded by a first insulation layer 204. Into an upper portion of each of the trenches 203, another doped poly-silicon layer is deposited and padded by a second insulation layer 207 to serve as a gate electrode onto the source electrode 205 and the first insulation layer 204, wherein the second insulation layer 207 has a thinner thickness than the first insulation layer 204. Between two adjacent the trenches 203, a pair of N type first doped column regions 208 are formed adjacent to sidewalls of the trenches and surround in parallel a P type second doped column region 209. Onto a top surface of the N type first doped column regions 208 and the P type second doped column regions 209 between a pair of adjacent trenches 203, a p body region 210 is formed with an n+ source region 211 near its top surface and flanking the trenches 203. Between a pair of the source regions 211, a p+ avalanche enhancement doped region 212 is formed with a p++ shallow contact doped region 213 near its top surface. Onto a top surface of the gate electrode 206, a contact interlayer 214 is formed to isolate the gate electrode 206 from a source metal formed onto the contact interlayer 214.

Figure 2B:
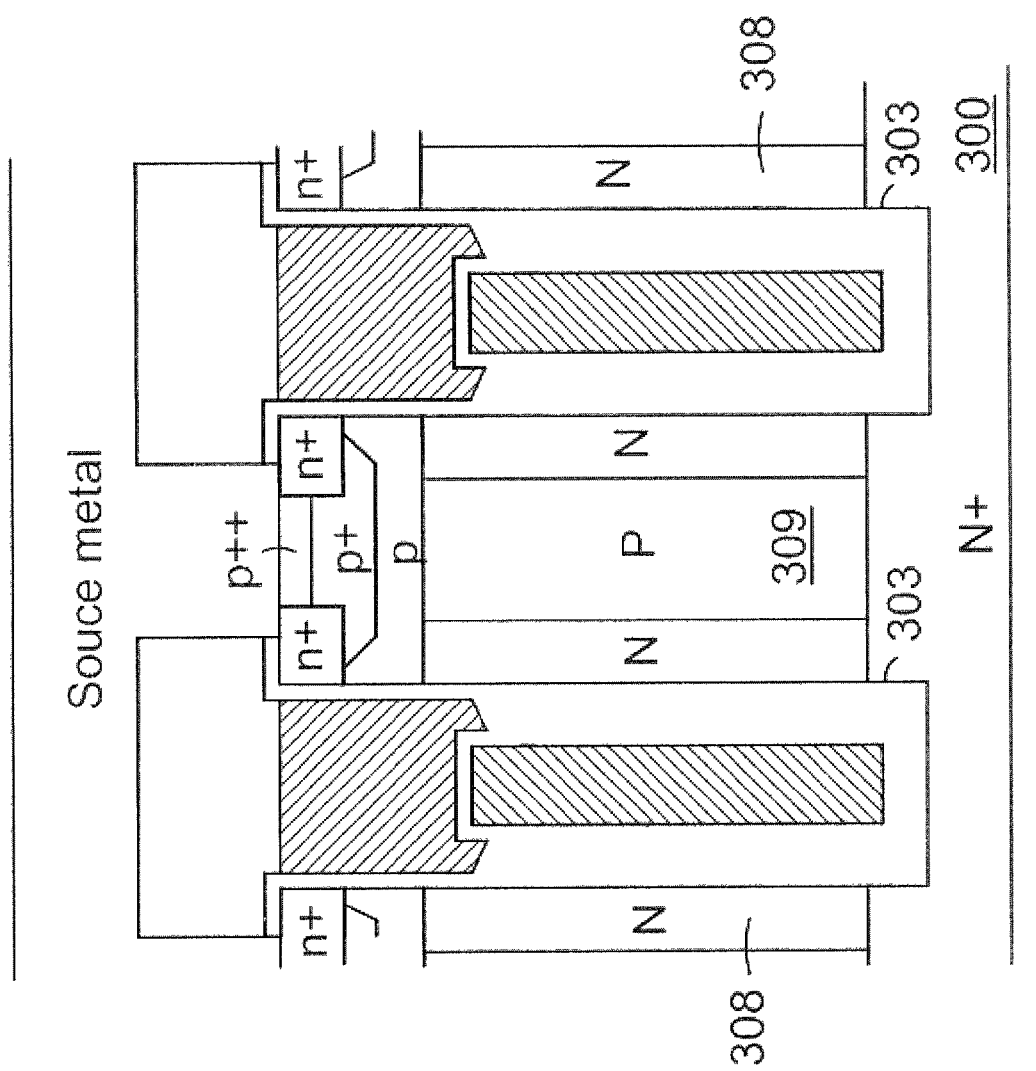
FIG. 2B is a cross-sectional view of another preferred embodiment according to the present invention.

FIG. 2B shows another preferred embodiment of the present invention, which is similar to that in FIG. 2A except that, in FIG. 2B, the trenches 303 are starting from the top surface of the N epitaxial layer and vertically down extending into the N+ substrate 300. Besides, the N type first doped column regions 308 and the P type second doped column regions 309 are reaching the interface of the N epitaxial layer and the N+ substrate 300.

Figure 2C:
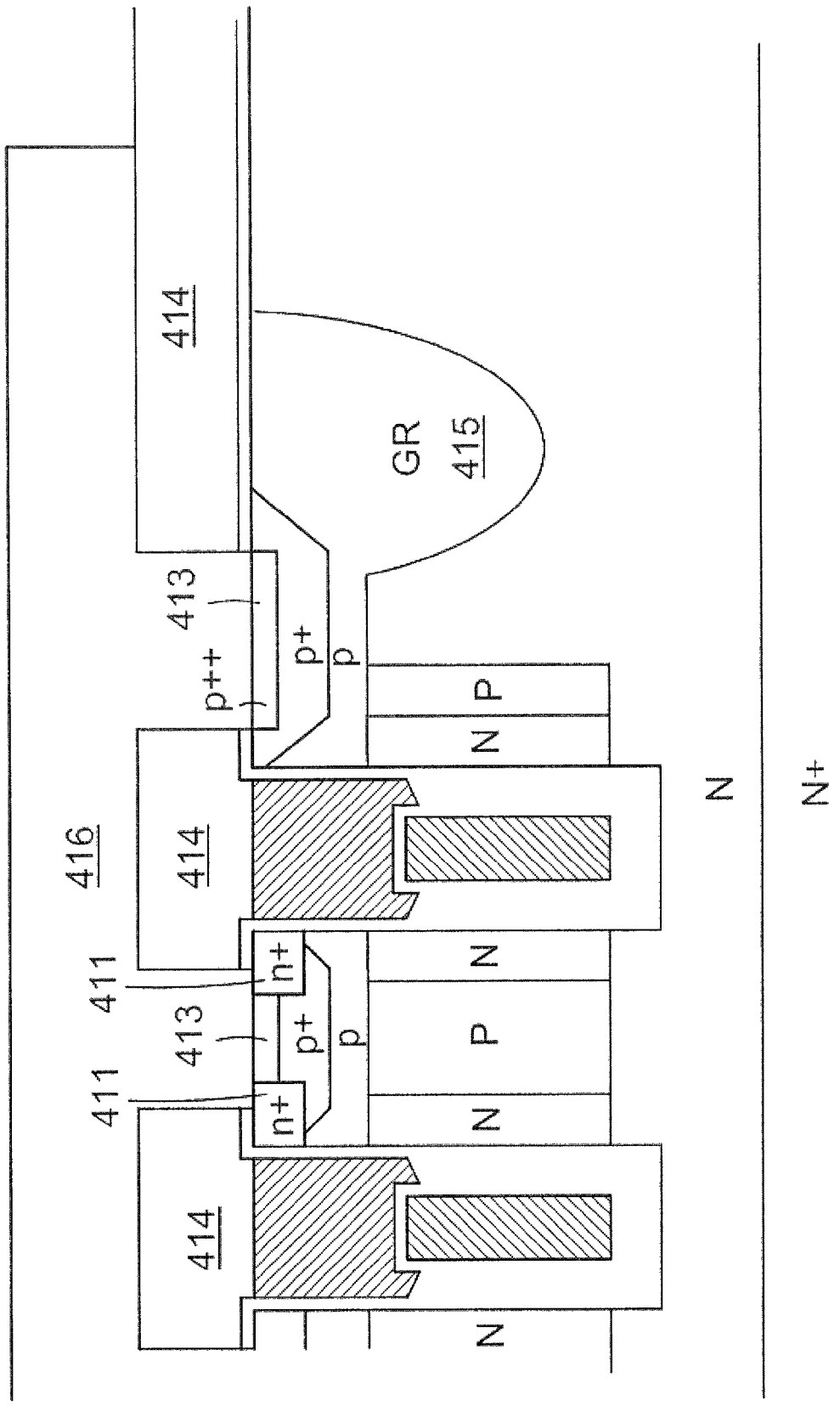
FIG. 2C is a cross-sectional view of another preferred embodiment according to the present invention.

FIG. 2C shown another preferred embodiment of the present invention, which is similar to that in FIG. 2A except that, in FIG. 2C, the N-channel super-junction trench MOSFET further comprises a guard ring 415 (GR, as illustrated in FIG. 2C) in a termination area. Besides, the source metal 416 is formed onto the contact interlayer 414 and penetrating through the contact. interlayer 414 to contact with the p++ shallow contact doped region 413 and the n+ source region 411 in an active area or only contact with the p++ shallow contact doped region 413 near the termination area.

Figure 2D:
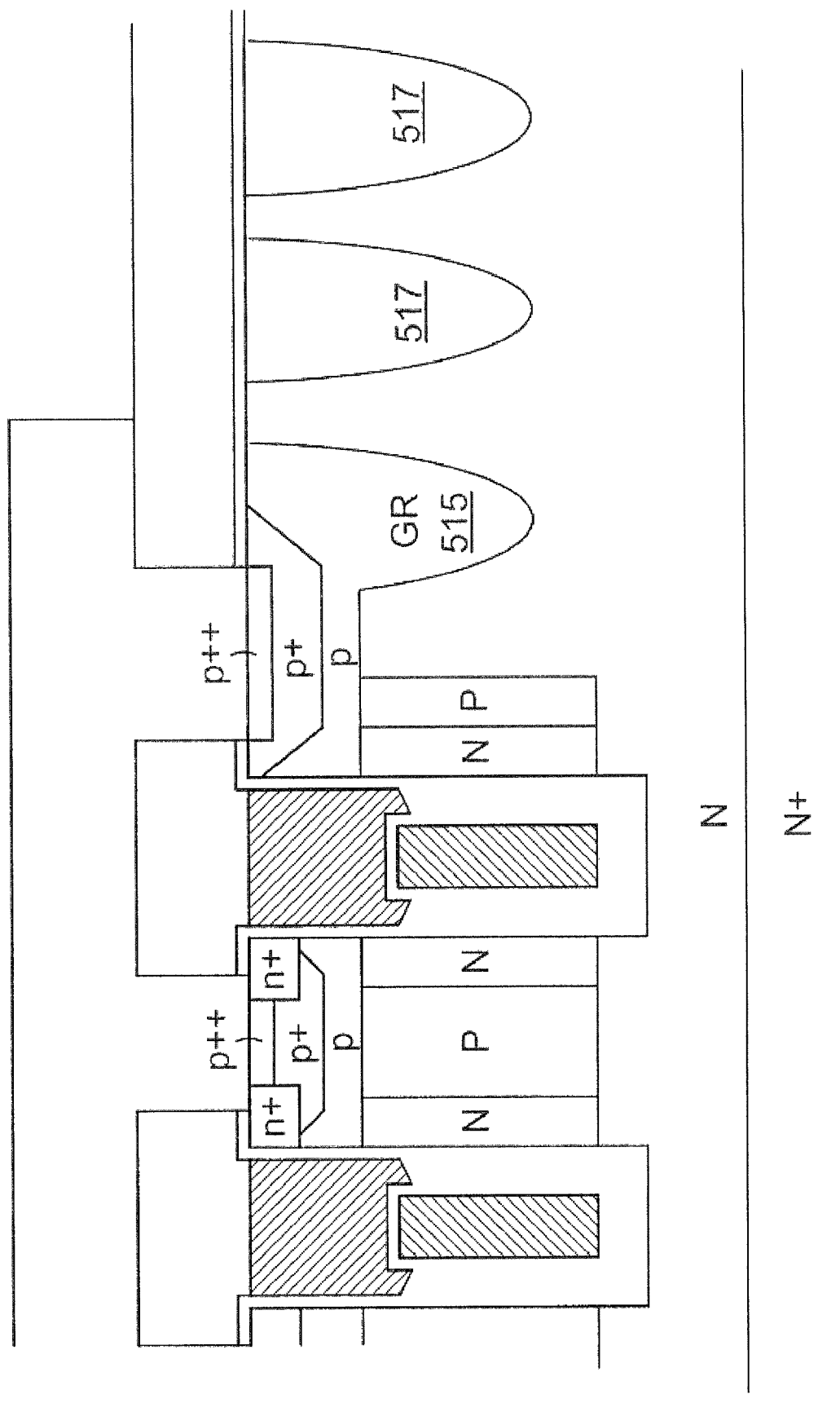
FIG. 2D is a cross-sectional view of another preferred embodiment according to the present invention.

FIG. 2D shows another preferred embodiment of the present invention, which is similar to that in FIG. 2C except that, in FIG. 2D, the N-channel super-junction trench MOSFET further comprises a guard ring 515 and multiple floating rings 517 in the termination area.

Figure 2E:
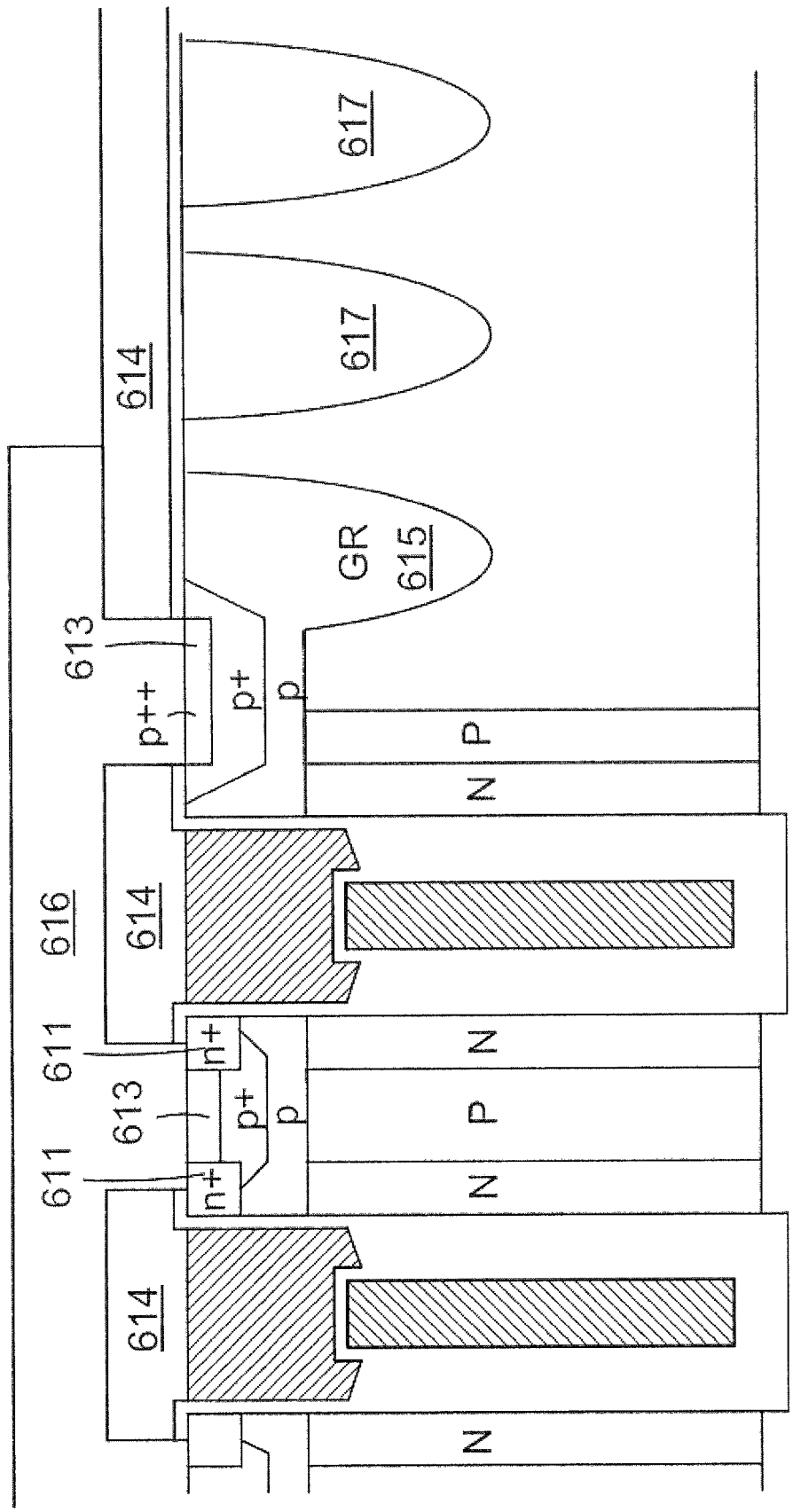
FIG. 2E is a cross-sectional view of another preferred embodiment according to the present invention.

FIG. 2E shows another preferred embodiment of the present invention, which is similar to that in FIG. 2B except that, in FIG. 2E, the N-channel super-junction trench MOSFET further comprises a guard ring 615 and multiple floating rings 617 in the termination area. Besides, the source metal 616 is formed onto the contact interlayer 614 and penetrating through the contact interlayer 614 to contact with the p++ shallow contact doped region 613 and the n+ source region 611 in the active area or only contact with the p++ shallow contact doped region 613 near the termination area.

Figure 3A:
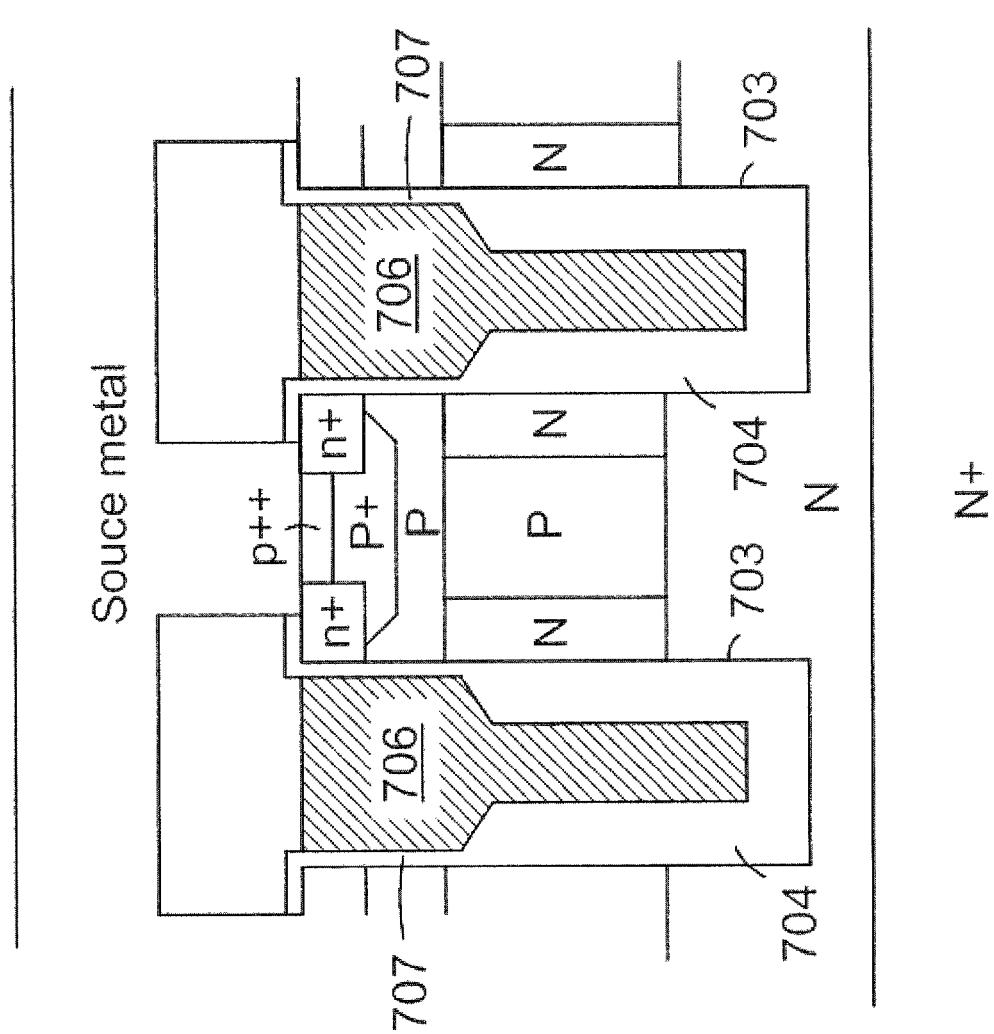
FIG. 3A is a cross-sectional view of another preferred embodiment according to the present invention.

FIG. 3A shows another preferred embodiment of the present invention, which is similar to that in FIG. 2A except that, in the trenches 703, a single gate electrode 706 is formed padded by the first insulation layer 704 in a lower portion and by the second insulation layer 707 in an upper portion. Furthermore, the second insulation layer 707 has a thinner thickness than, the first insulation layer 704.

Figure 3B:
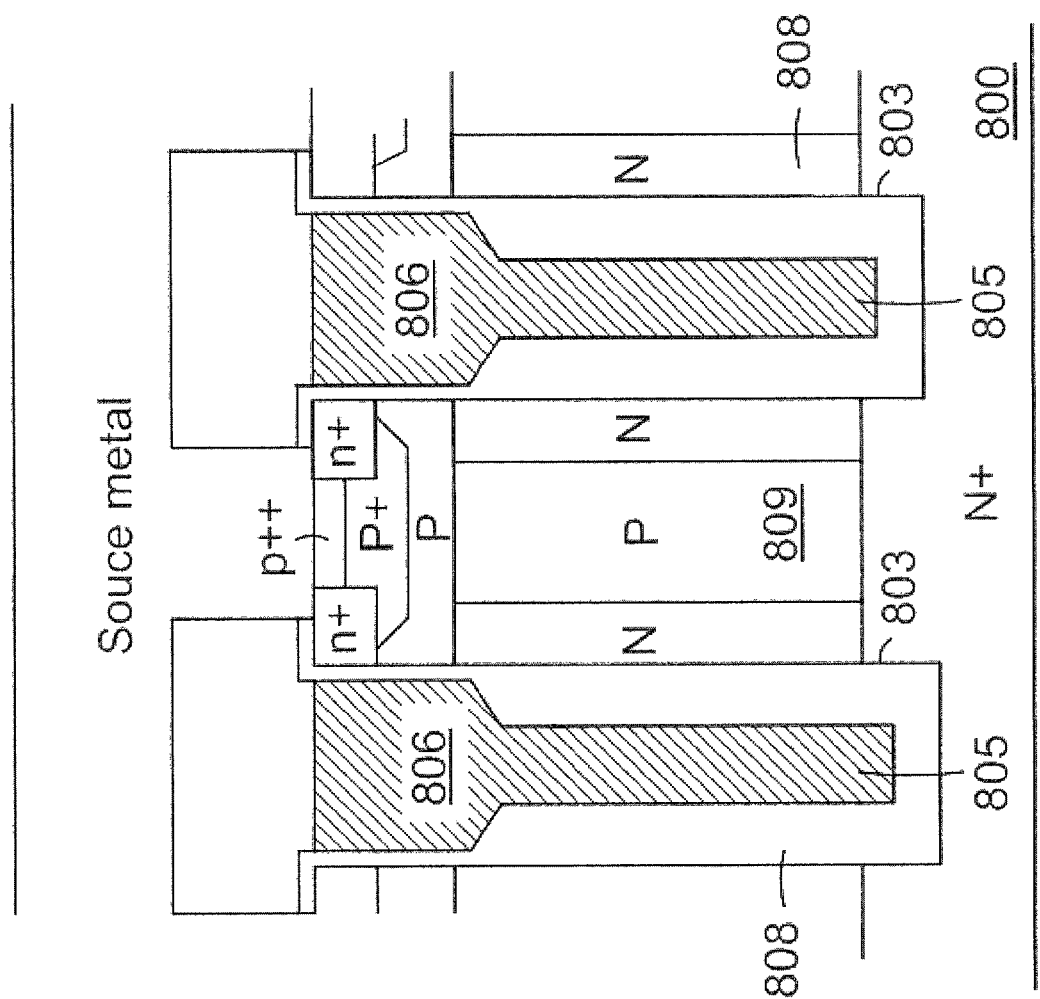
FIG. 3B is a cross-sectional view of another preferred embodiment according to the present invention.

FIG. 3B shows another preferred embodiment of the present invention, which is similar to that in FIG. 3A except that, in FIG. 3B, the trenches 803 are starting from the top surface of the N epitaxial layer and vertically down extending into the N+ substrate 800, the single gate electrode 806 is also extending into the N+ substrate 800. Besides, the N type first doped column regions 808 and the P type second doped column regions 809 are reaching the interface of the N epitaxial layer and the substrate.

Figure 4A:
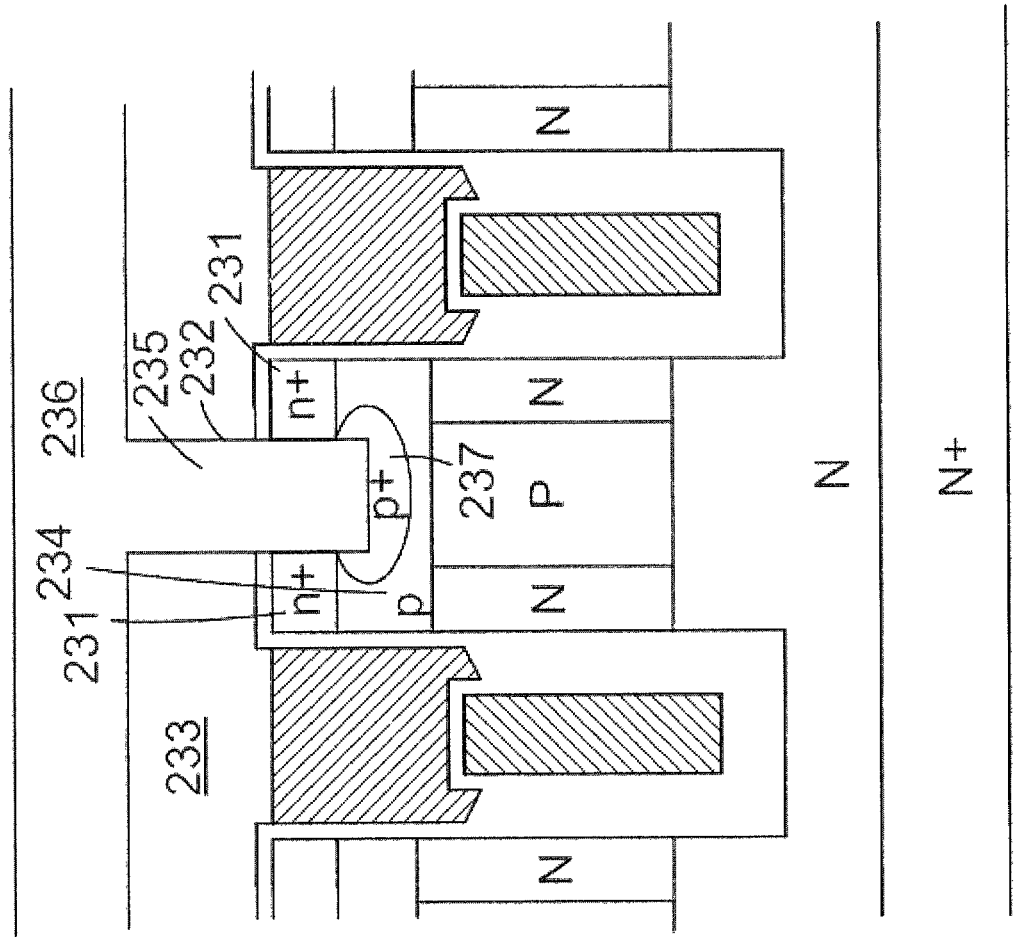
FIG. 4A is a cross-sectional view of another preferred embodiment according to the present invention.

FIG. 4A shows another preferred embodiment of the present invention, which is similar to that in FIG. 2A except that, in FIG. 4A, the source metal 236 is connected to the n+ source region 231 by a trenched source-body contact 232 instead of planar contact in FIG. 2A. The trenched source-body contact 232 is penetrating through the contact interlayer 233, the n+ source region 231 and extending into the p body region 234, the trenched source-body contact 232 is filled with the source metal 236 composed of an Al alloys layer padded by a barrier metal layer of Ti/TiN or Co/TiN as a contact metal plug 235, for example, a source metal plug as employed in FIG. 4A. Furthermore, in the p body region 234, a p+ body contact doped region 237 is formed surrounding at least bottom of the trenched source-body contact 232 underneath the n+ source region 231 to reduce the contact resistance between the p body region 234 and the contact metal plug 235 in the trenched source-body contact 232.

Figure 4B:
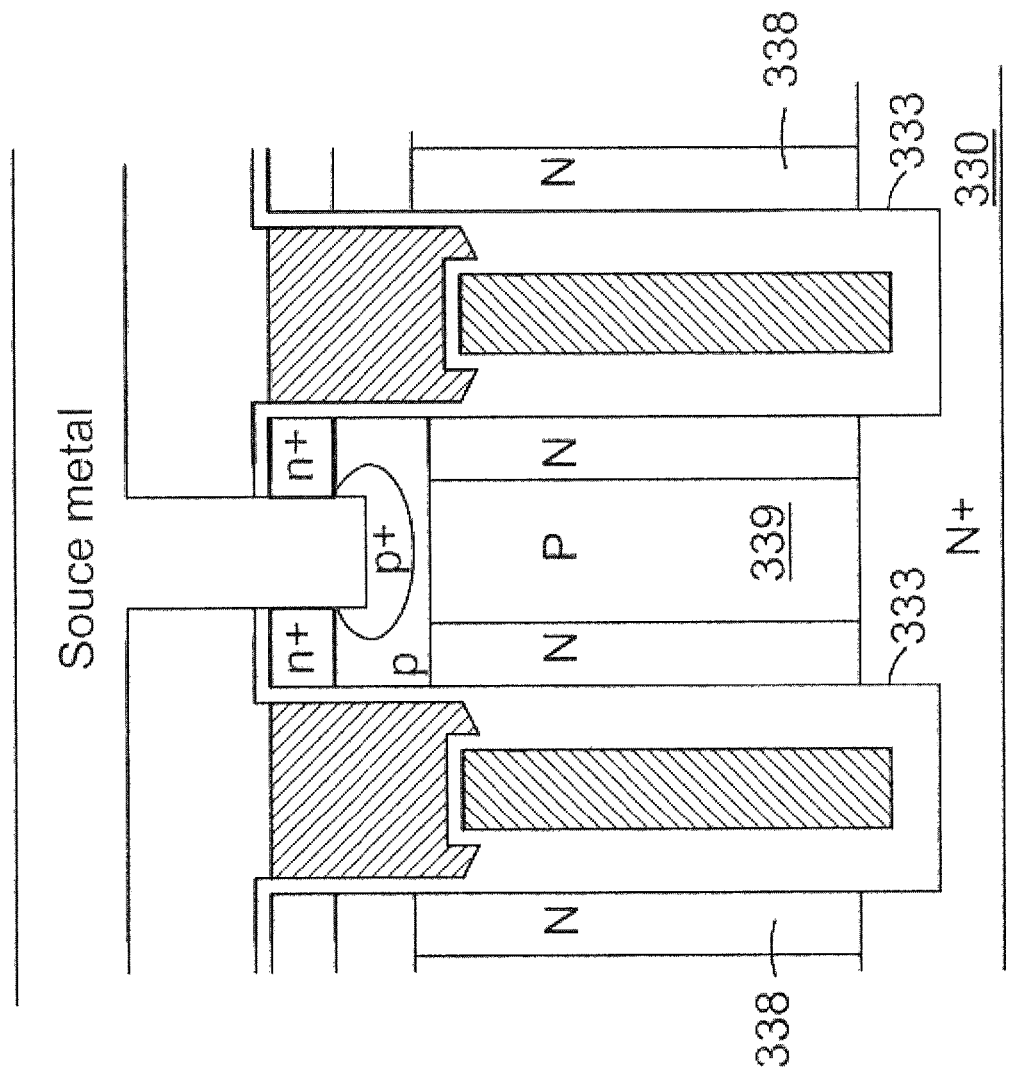
FIG. 4B is a cross-sectional view of another preferred embodiment according to the present invention.

FIG. 4B shows another preferred embodiment of the present invention, which is similar to that in FIG. 4A except that, in FIG. 4B, the trenches 333 are starting from the top surface of the N epitaxial layer and vertically down extending into the N+ substrate 330. Besides, the N type first doped column regions 338 and the P type second doped column regions 339 are reaching the interface of the N epitaxial layer and the N+ substrate 300.

FIG. 4C shows another preferred embodiment of the present invention, which is similar to that in FIG. 4A except that, in FIG. 4A, the n+ source region 231 is formed by ion implantation and has a uniform doping concentration and junction depth from along sidewalls of the trenched source-body contact 232 to along a channel region near the trenches. However, in FIG. 4C, the n+ source region 431 is formed by lateral diffusion and has a higher doping concentration and a greater junction depth along the sidewalls of the trenched source-body contact 432 than along the channel region near the trenches 433, furthermore, the n+ source region 431 has a doping profile of a Gaussian-distribution from the sidewalls of the trenched source-body contact 432 to the channel region near the trenches 433.

FIG. 4D shows another preferred embodiment of the present invention, which is similar to that in FIG. 4A except that, in FIG. 4D, the contact metal plug 535 in the trenched source-body contact 532 is a tungsten layer padded by a barrier metal layer of Ti/TiN or Co/TiN. An Al alloys layer overlying a contact resistance reduction layer of Ti or Ti/TiN as a source metal onto a contact interlayer and the contact metal plug 535.

FIG. 5A shows another preferred embodiment of the present invention, which is similar to that in FIG. 4A except that, in FIG. 5A, the N-channel super-junction trench MOSFET further comprises multiple p body regions 630 having floating voltage in a termination area. Besides, the source metal 636 is formed onto the contact interlayer 631 and penetrating through the contact interlayer 631 to contact with the n+ source region 632, the p body region 630 and the p+ body contact doped region 633 in the active area or only contact with the p body region 630 and the p+ body contact doped region 633 near the termination area.

Figure 5B:
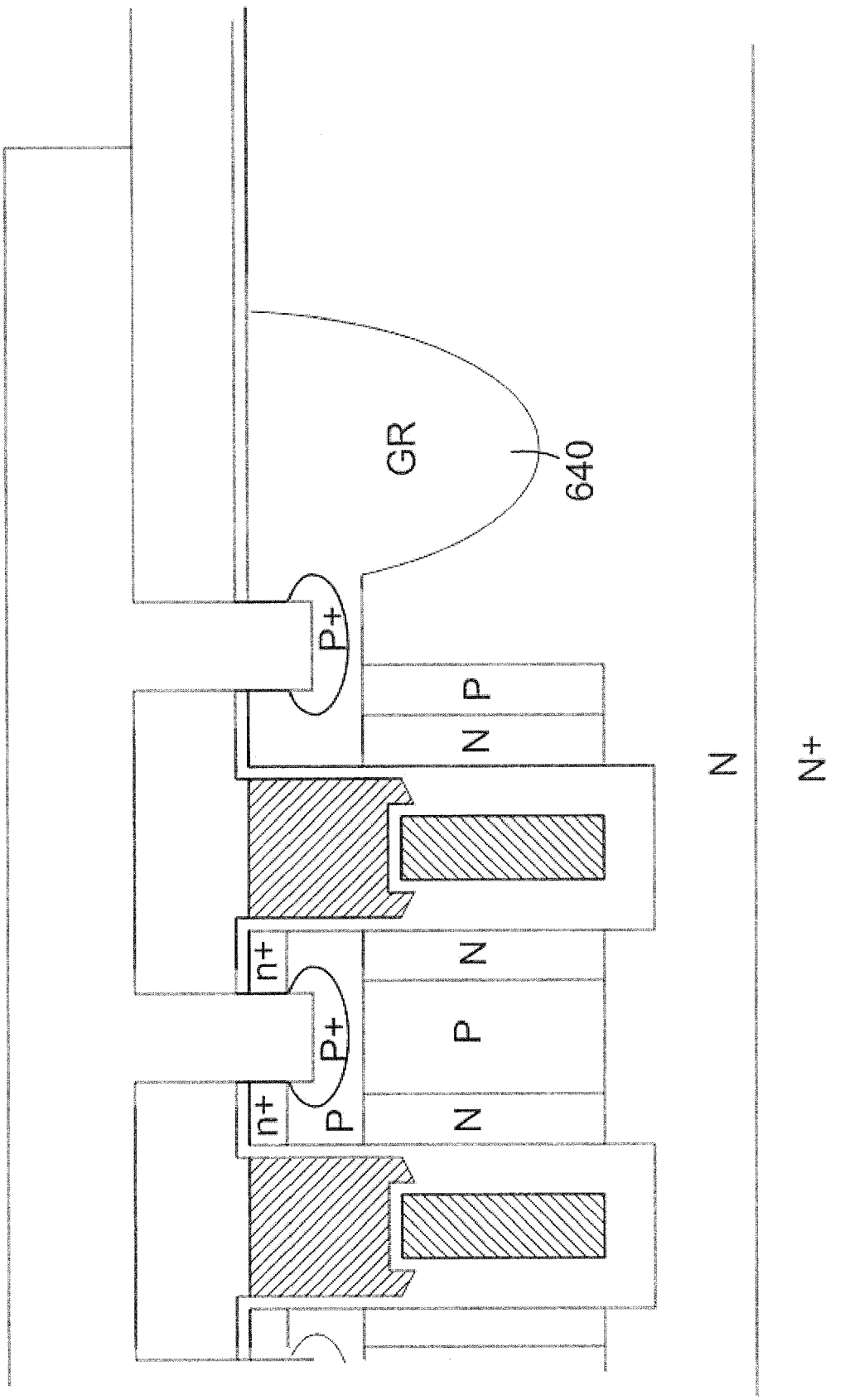
FIG. 5B is a cross-sectional view of another preferred embodiment according to the present invention.

FIG. 5B shows another preferred embodiment of the present invention, which is similar to that in FIG. 5A except that in FIG. 5B, the N-channel super-junction trench MOSFET comprises a different termination area comprising a P type guard ring 640 (GR, as illustrated in FIG. 5B) having junction depth greater than the P body regions.

Figure 5C:
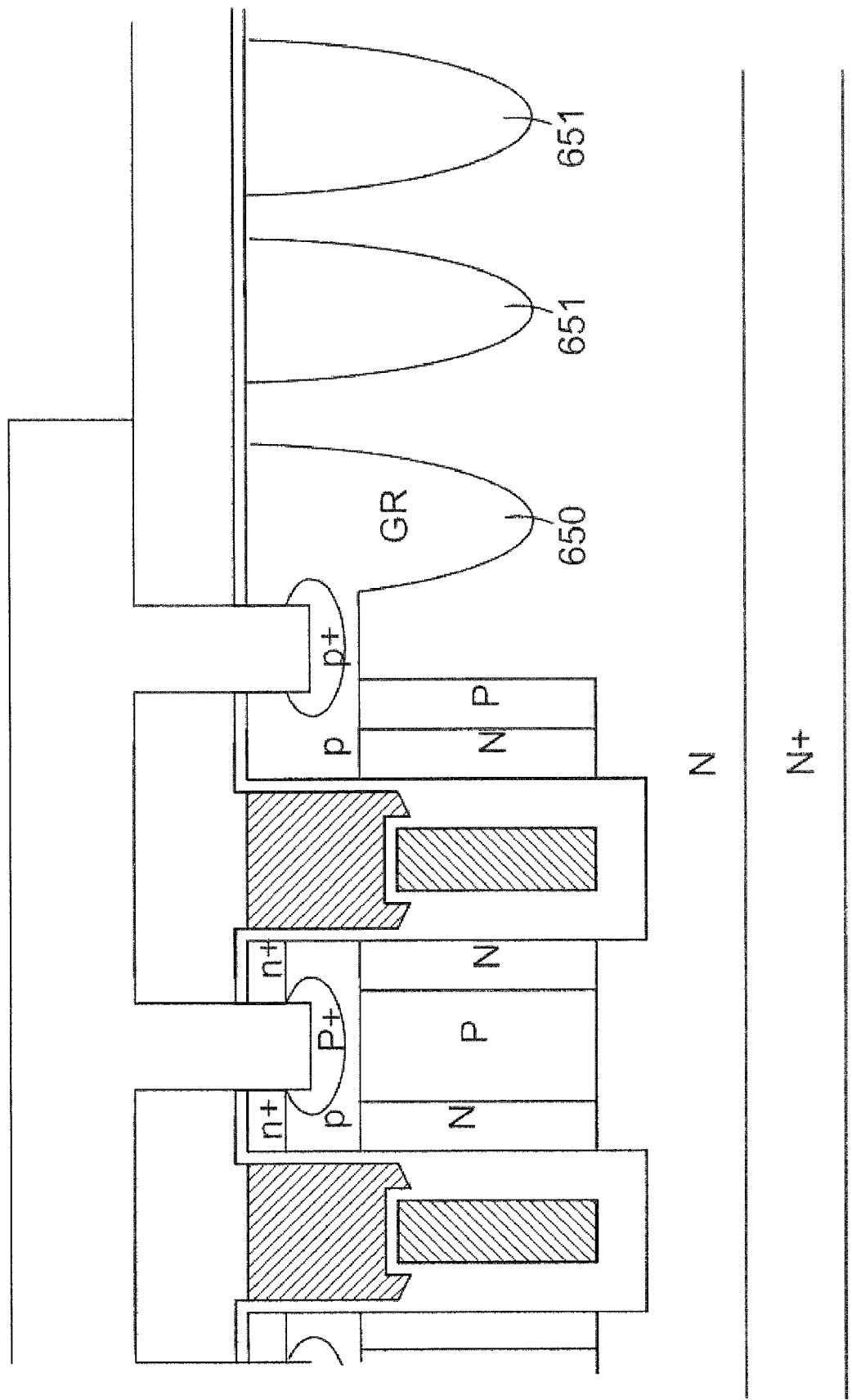
FIG. 5C is a cross-sectional view of another preferred embodiment according to the present invention.

FIG. 5C shows another preferred embodiment of the present invention, which is similar to that in FIG. 5B except that, in FIG. 5C, the N-channel super-junction trench MOSFET further comprises a P guard ring 650 connected with the source regions, and multiple P type floating guard rings 651 having floating voltage in the termination area wherein the P type guard ring 650 and the multiple P type floating rings 651 have greater junction depths than the P body regions.

Figure 5D:
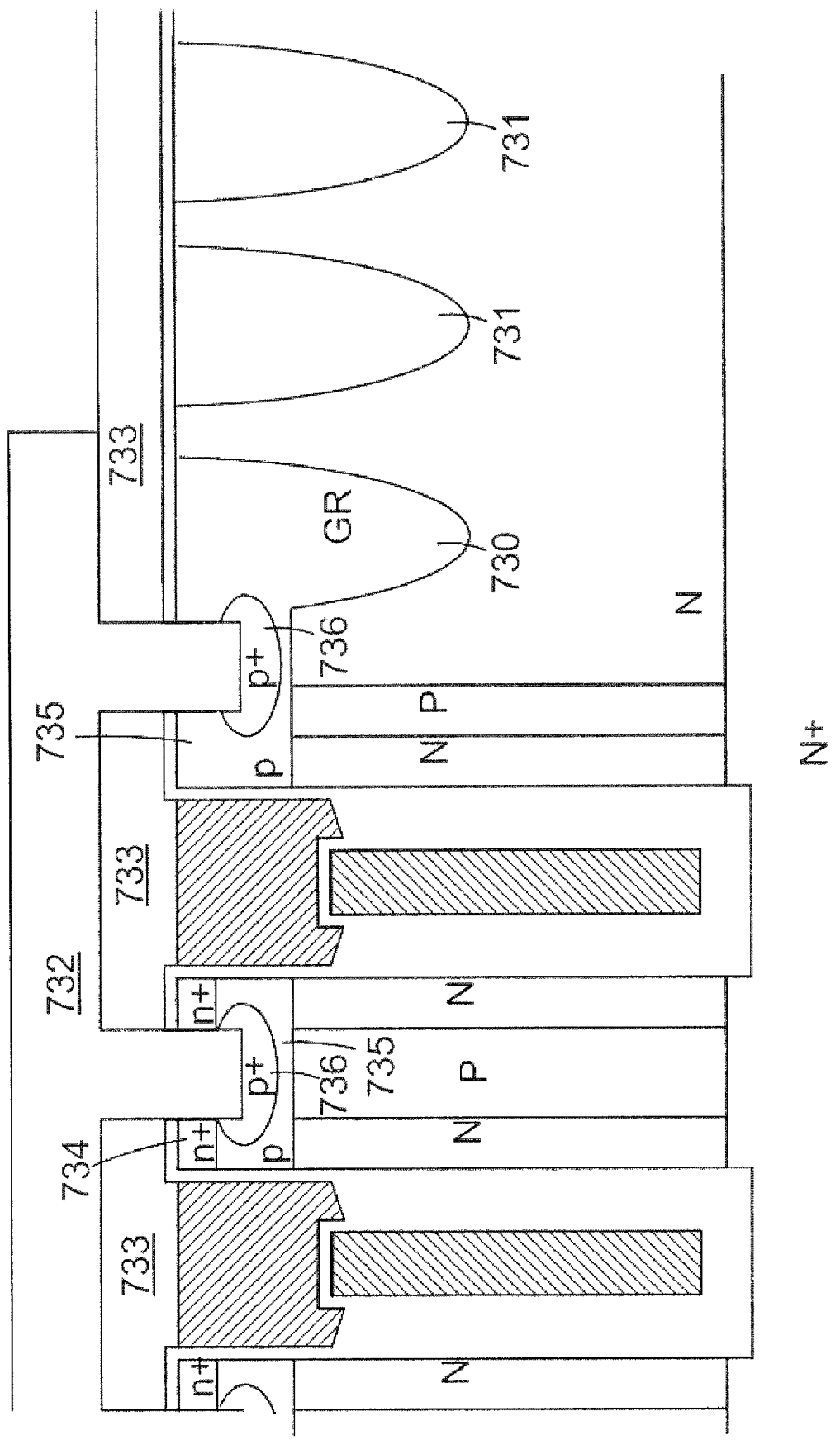
FIG. 5D is a cross-sectional view of another preferred embodiment according to the present invention.

FIG. 5D shows another preferred embodiment of the present invention, which is similar to that in FIG. 4B except that, in FIG. 5D, the N-channel super-junction trench MOSFET further comprises a P type guard ring 730 and multiple P type floating guard rings 731 in the termination area. Besides, the source metal 732 is formed onto the contact interlayer 733 and penetrating through the contact interlayer 733 to contact with the n+ source region 734, the p body region 735 and the p+ body contact doped region 736 in the active area or only contact with the p body region 735 and the p+ body contact region 736 near the termination area.

Figure 6A:
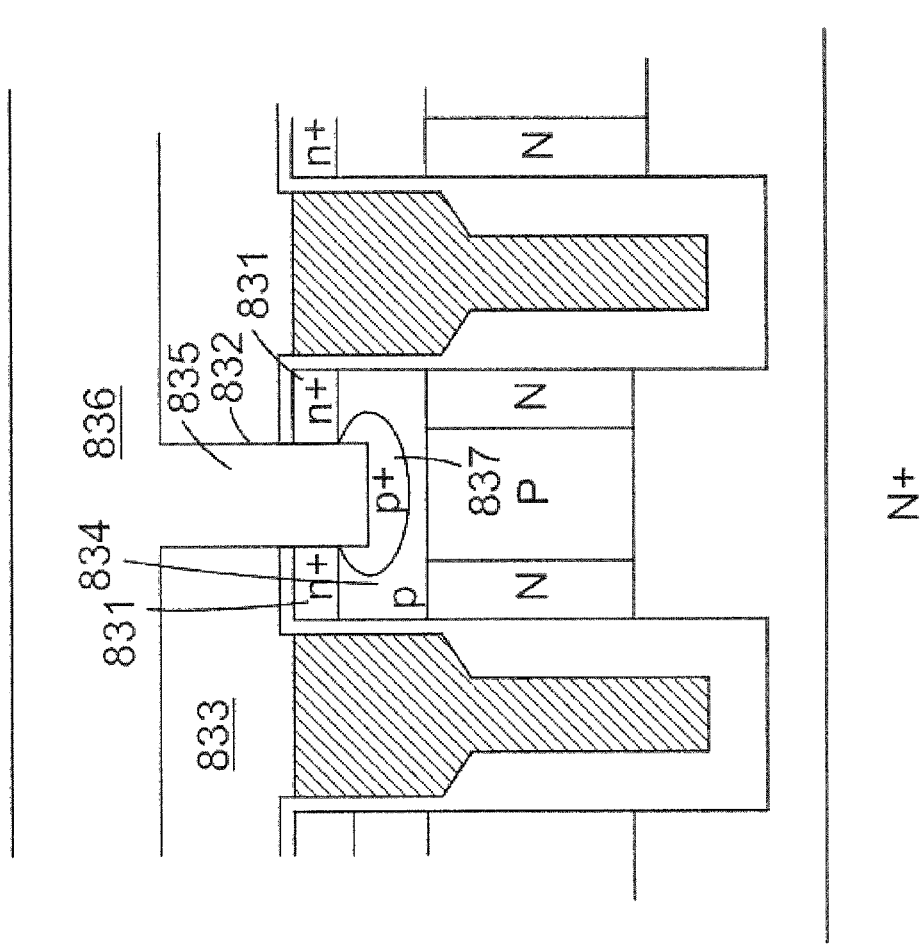
FIG. 6A is a cross-sectional view of another preferred embodiment according to the present invention.

FIG. 6A shows another preferred embodiment of the present invention, which is similar to that in FIG. 3A except that, in FIG. 6A, the source metal 836 is connected to the n+ source region 831 by a trenched source-body contact 832 instead of planar contact in FIG. 3A. The trenched source-body contact 832 is penetrating through the contact interlayer 833, the n+ source region 831 and extending into the p body region 834, the trenched source-body contact 832 is filled with the source metal 836 composed of an Al alloys layer padded by a barrier metal layer of Ti/TiN or Co/TiN as a contact metal plug 835, for example, a source metal plug as employed in FIG. 6A. Furthermore, in the p body region 834, a p+ body contact doped region 837 is formed surrounding at least bottom of the trenched source-body contact 832 underneath the n+ source region 831 to reduce the contact resistance between the p body region 834 and the contact metal plug 835 in the trenched source-body contact 832.

Figure 6B:
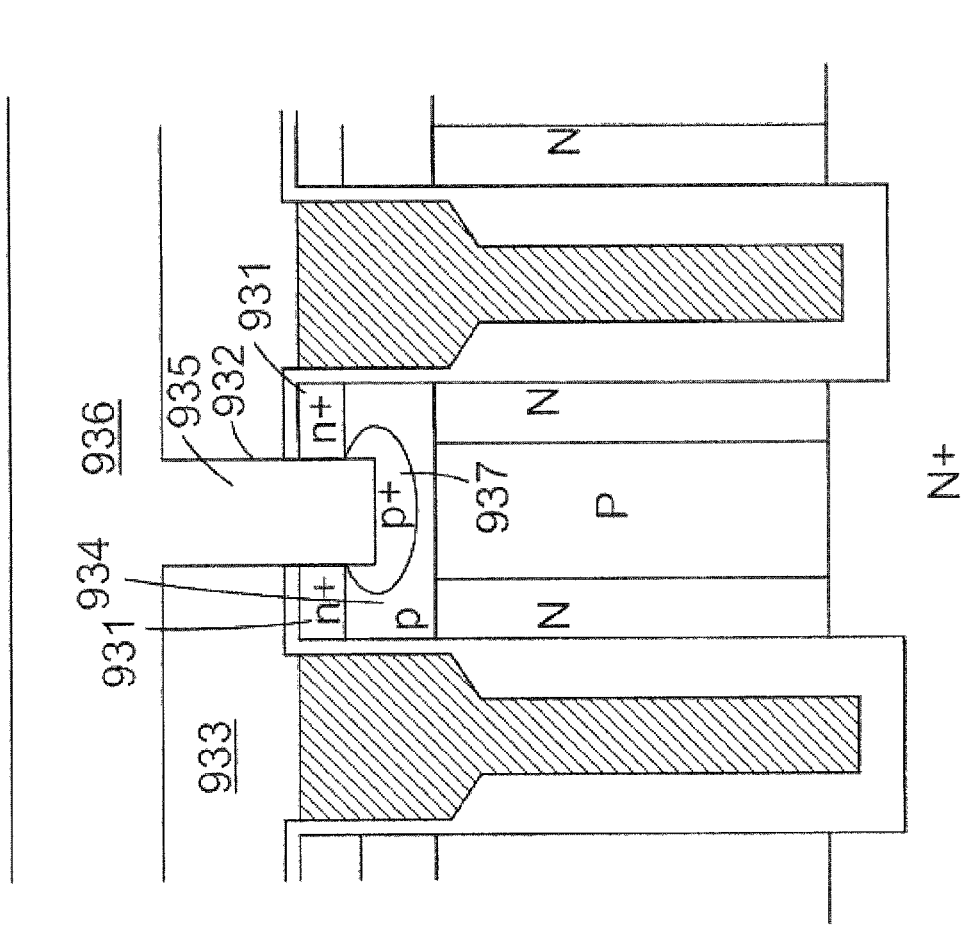
FIG. 6B is a cross-sectional view of another preferred embodiment according to the present invention.

FIG. 6B shows another preferred embodiment of the present invention, which is similar to that in FIG. 3B except that, in FIG. 6B, the source metal 936 is connected to the n+ source region 931 by a trenched source-body contact 932 instead of planar contact in FIG. 3B. The trenched source-body contact 932 is penetrating through the contact interlayer 933, the n+ source region 931 and extending into the p body region 934, the trenched source-body contact 932 is filled with the source metal 936 composed of an Al alloys layer padded by a barrier metal layer of Ti/TiN or Co/TiN as a contact metal plug 935, for example, a source metal plug as employed in FIG. 6B. Furthermore, in the p body region 934, a p+ body contact doped region 937 is formed surrounding at least bottom of the trenched source-body contact 932 underneath the n+ source region 931 to reduce the contact resistance between the p body region 934 and the contact metal plug 935 in the trenched source-body contact 932.

Figure 7A:
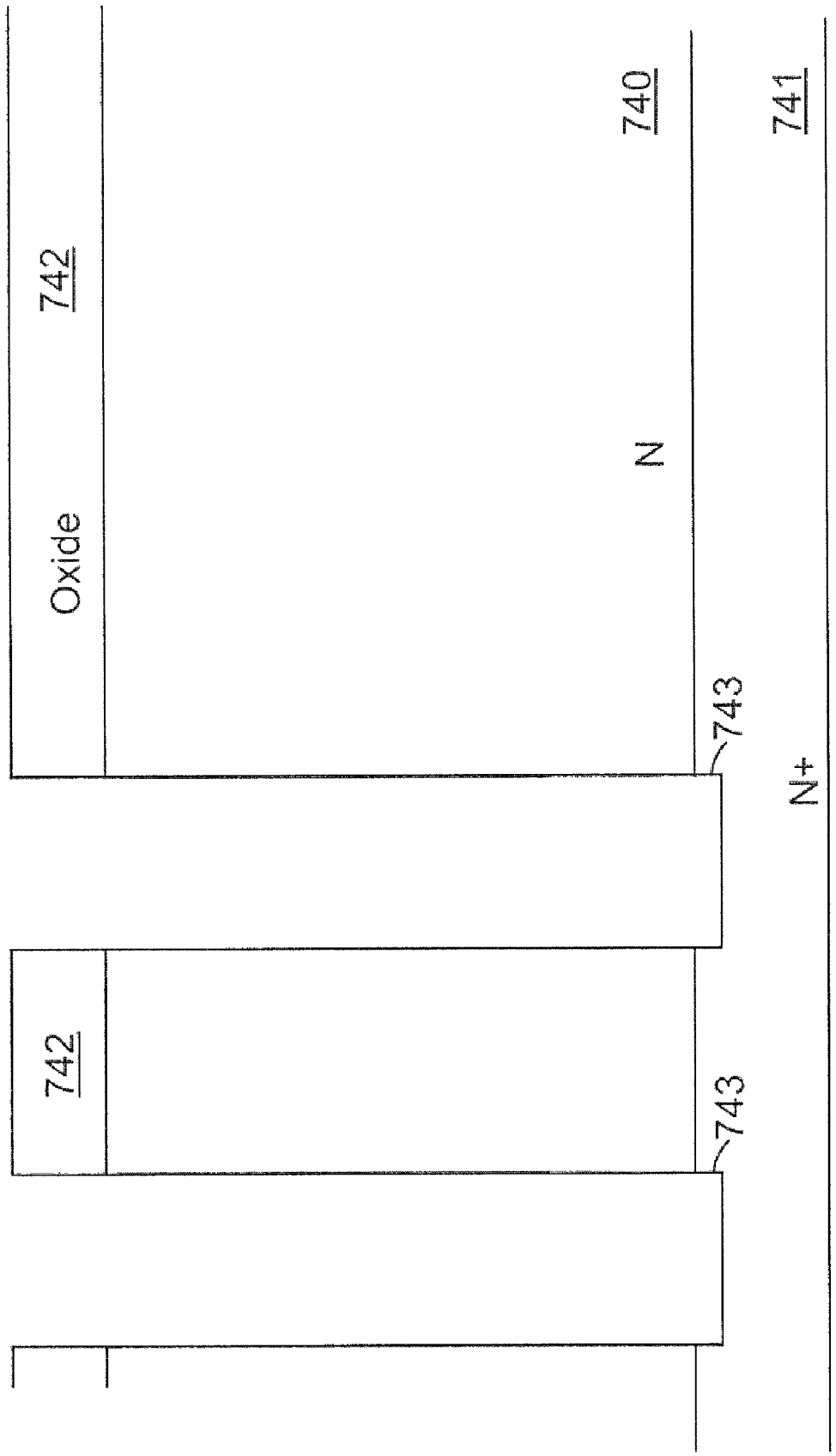

FIGS. 7A to 7G are a series of exemplary steps that are performed to form the inventive super-junction trench MOSFET in FIG. 5D. In FIG. 7A, an N epitaxial layer 740 is grown on an N+ substrate 741. Next, an oxide layer 742 is formed onto a top surface of the N epitaxial layer 740. Then, after a trench mask (not shown) is applied onto the oxide layer 742, a plurality of trenches 743 are etched penetrating through the oxide layer 742, the N epitaxial layer 740 and extending into the N+ substrate 741 by successively dry oxide etch and dry silicon etch.

Figure 7B:
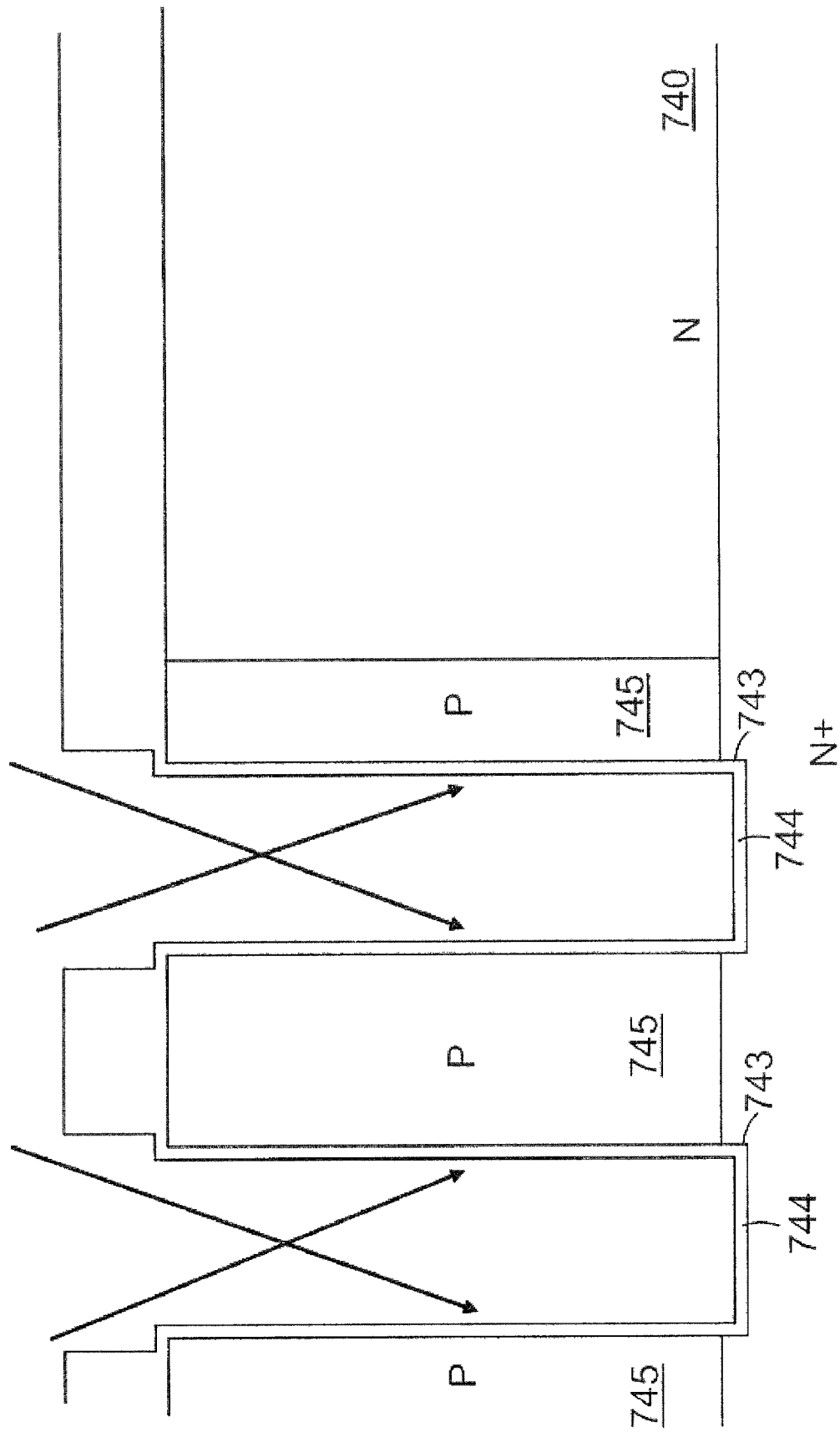

In FIG. 7B, a sacrificial oxide (not shown) is first grown and then removed to eliminate the plasma damage introduced during opening the trenches 743. After that, a screen oxide 744 is grown along an inner surface of the trenches 743. Then, a step of angle Ion Implantation of Boron dopant is carried out to form a P type doped column regions 745 with a column shape adjacent to sidewalls of the trenches 743 within the N epitaxial layer 740.

In FIG. 7C, another angle Ion Implantation of Arsenic or Phosphorus dopant is carried out to form an N type doped column regions 746 with a column shape adjacent to the sidewalls of the trenches 743, formed in parallel and surrounding the P type second doped column regions 745.

Figure 7D:
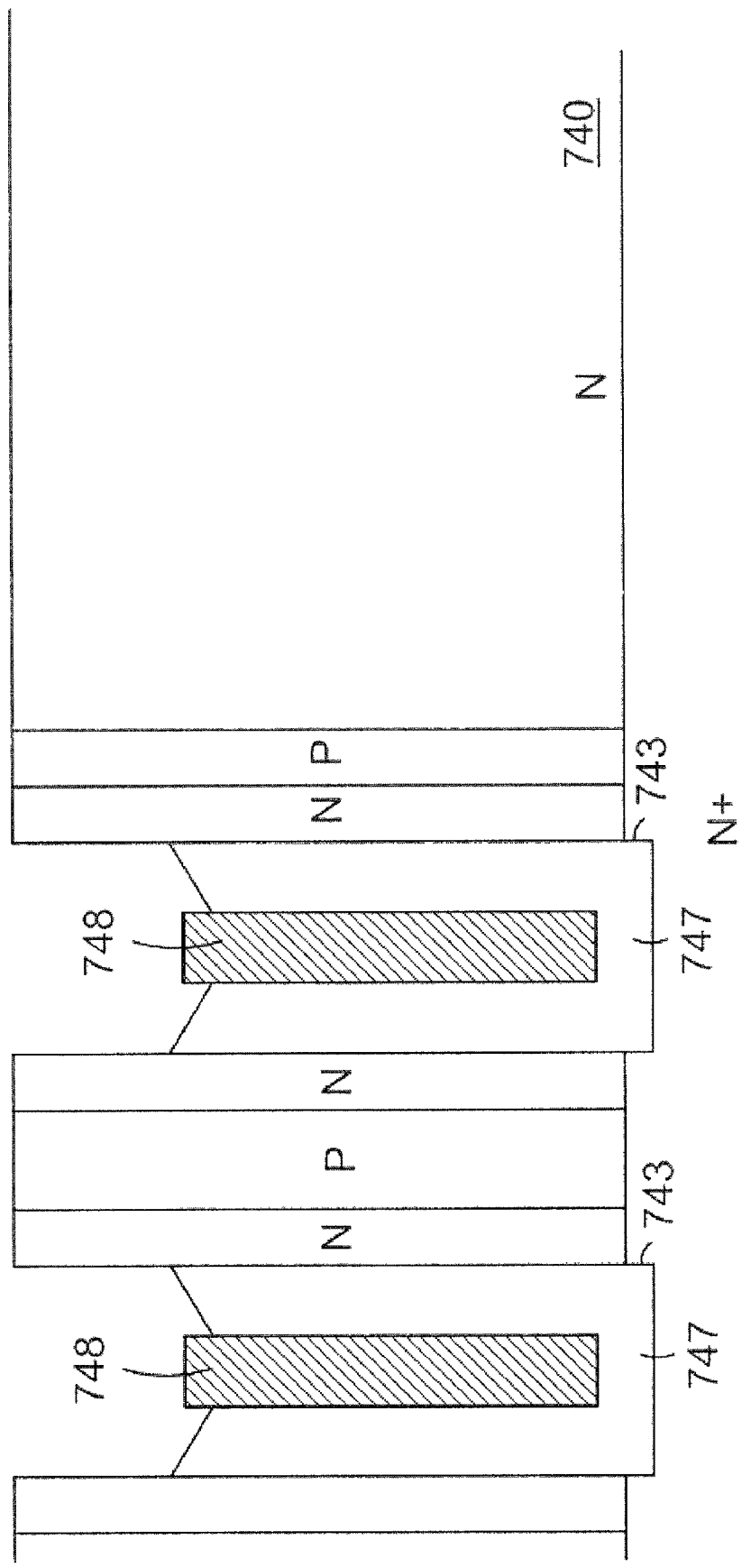

In FIG. 7D, a first insulation layer 747 is formed lining the inner surface of the trenches 743 by thermal oxide growth or thick oxide deposition. Then, a doped poly-silicon layer is deposited onto the first insulation layer 747 filling the trenches 743 to serve as a source electrode 758. Next, the source electrode 748 and the first insulation layer 747 are etched back, leaving enough portions in a lower portion of the trenches 743.

Figure 7E:
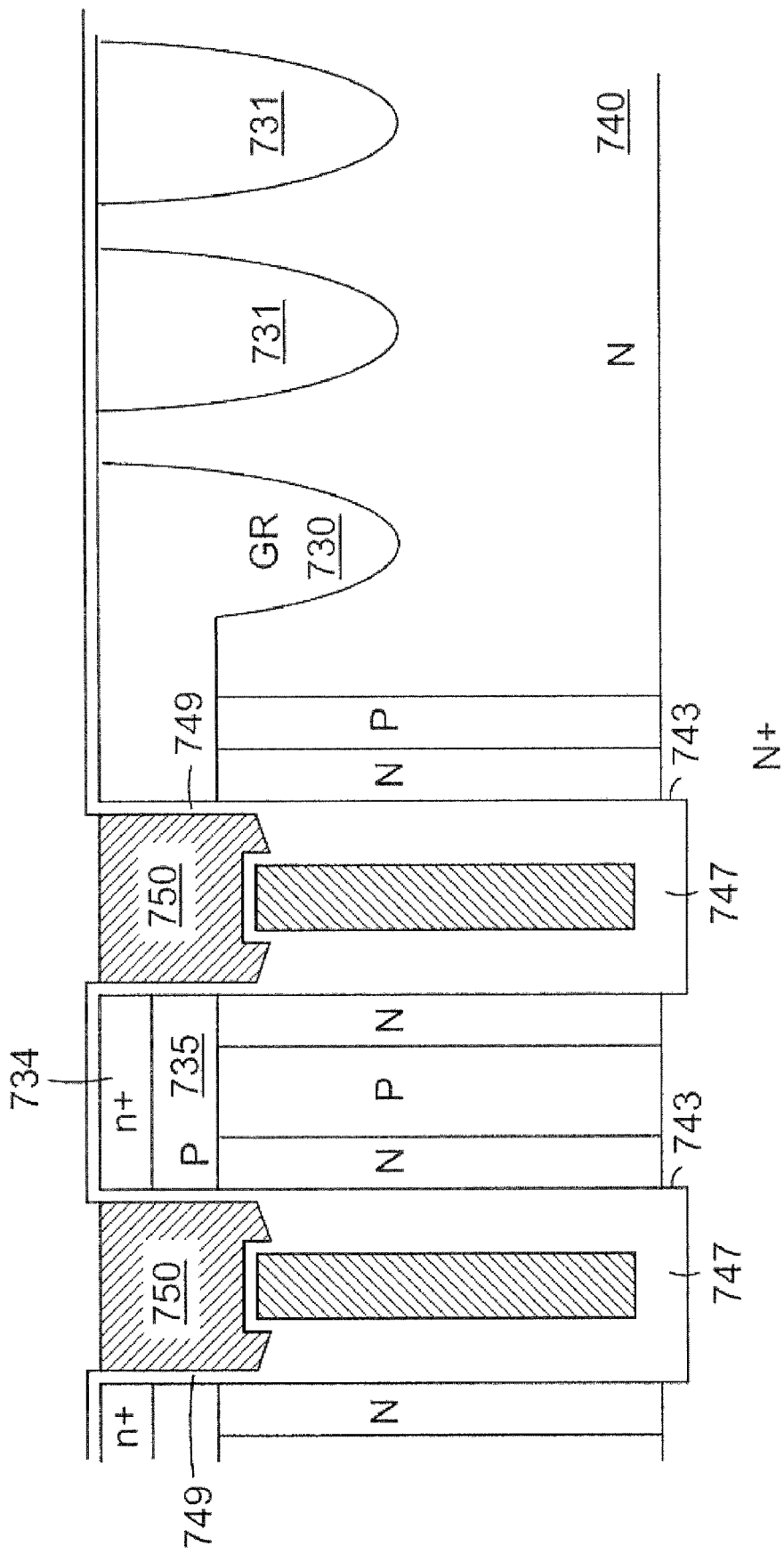

In FIG. 7E, a second insulation layer 749 is grown along upper sidewalls of the trenches 743 and a top surface of the source electrode, and the second insulation layer 749 has a thinner thickness than the first insulation layer 747. Then, another doped poly-silicon layer is deposited onto the second insulation layer 749 filling an upper portion of the trenches 743 to serve as a gate electrode 750. Next, the gate electrode 750 is etched back by CMP or Plasma Etch. After applying a Guard Ring mask (not shown) onto the top surface of the N epitaxial layer 740, a step of Ion Implantation with P type dopant is carried out and followed by a diffusion step to form a Guard Ring 730 and multiple floating rings 731 in a termination area. Then, after applying a body mask (not shown), another step of Ion Implantation with P type dopant is carried out and followed by a diffusion step to form a p body region 735 between every two adjacent of the trenches 743 and onto the N type first doped column regions and the P type second doped column regions. Then, after applying a source mask (not shown), a step of Ion Implantation with N type dopant is carried out to form an n+ source region 734 near a top surface of the P body region 735 and flanking the trenches 743, and the n+ source region 734 has a higher doping concentration than the N epitaxial layer 740.

Figure 7F:
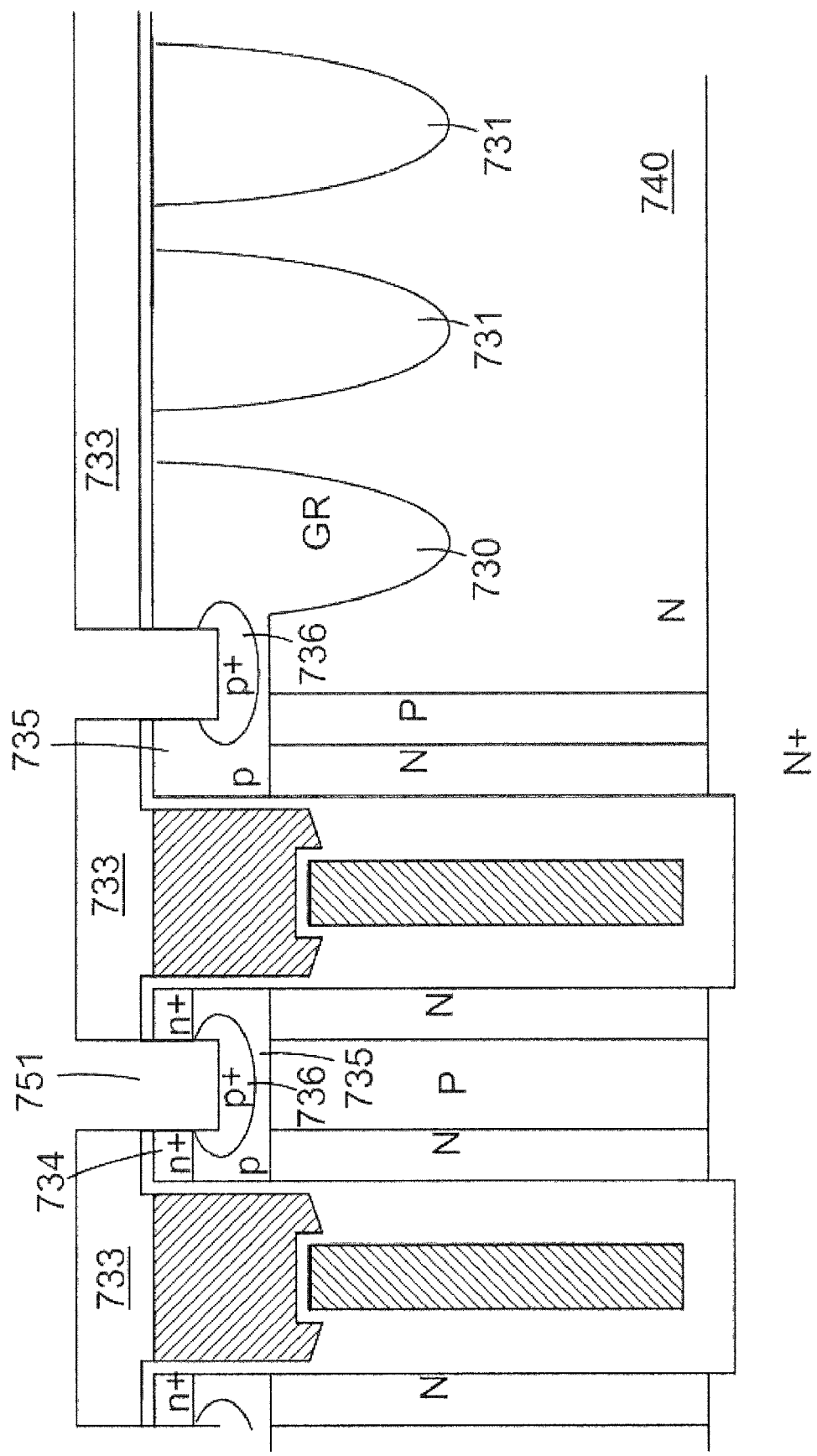

In FIG. 7F, an oxide layer is deposited onto the top surface of the N epitaxial layer 740 to serve as a contact interlayer 733. Then, after applying a contact mask (not shown) onto the contact interlayer 733, contact trenches 751 are formed by successively dry oxide etching and dry silicon etching. The contact trenches 751 are penetrating through the contact interlayer 733, the n+ source region 734 and extending into the p body region 735 in an active area, or penetrating the contact interlayer 733 and extending into the p body region 735 near the termination area. Next, a BF2 Ion Implantation is performed to form a p+ body contact doped region 736 within the p body region 735 and surrounding at least bottom of each the contact hole 751.

Figure 7G:
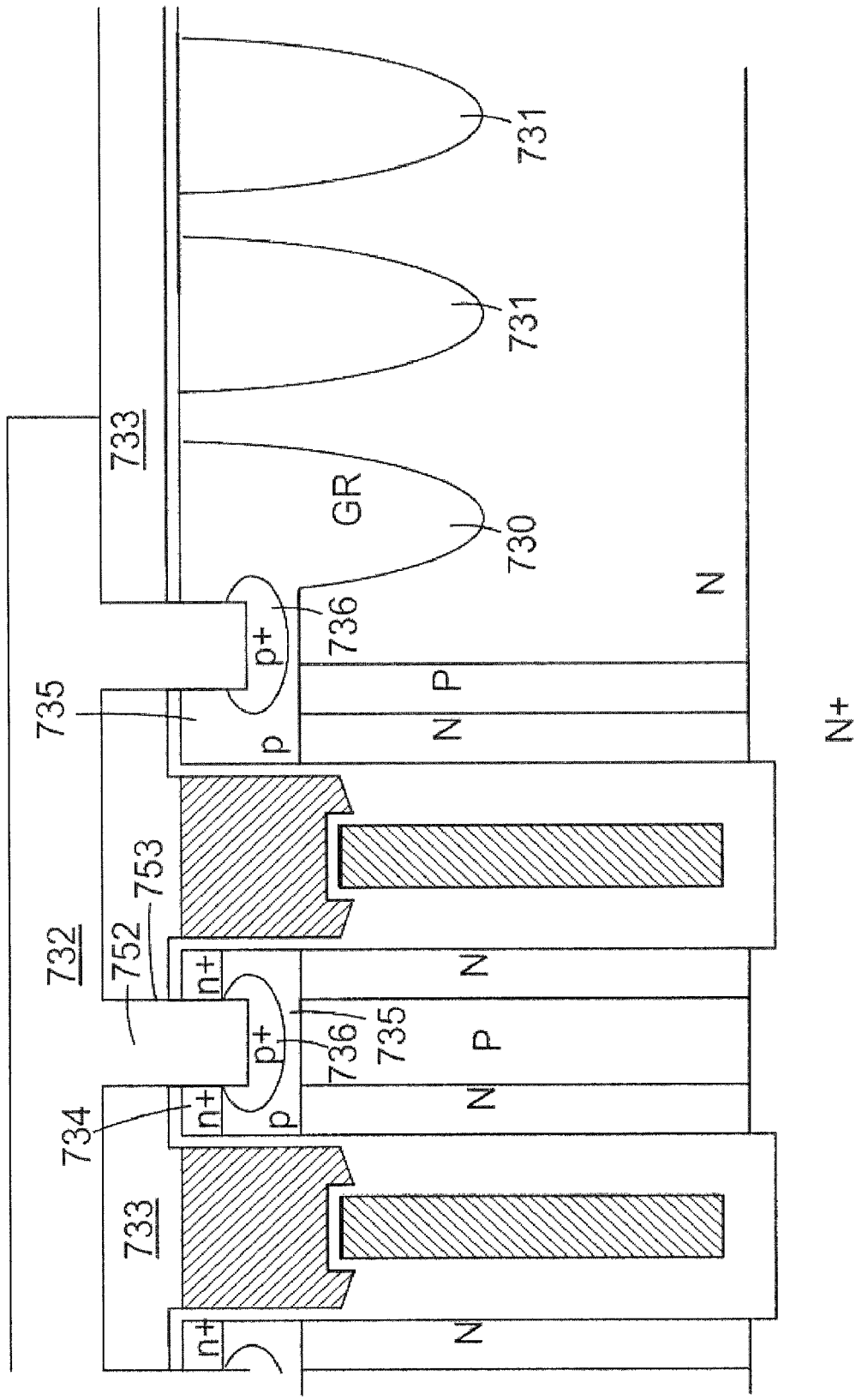

In FIG. 7G, a metal layer comprising Al alloys padded with a resistance-reduction layer Ti or Ti/TiN is deposited onto a top surface of the contact interlayer 733 and extending into the contact holes 751 to serve as a source metal plug 752 for a trenched source-body contact 753. Then, After applying a source mask (not shown), the metal layer is etched to function as a source metal 732 to contact with the n+source region 734 and the p body region 735.

Although the present invention has been described in terms of the presently preferred embodiments, it is to be understood that such disclosure is not to be interpreted as limiting. Various alternations and modifications will no doubt become apparent to those skilled in the art reading the above disclosure. Accordingly, it is intended that the appended claims be interpreted as covering all alternations and modifications as fall within the true spirit and scope of the invention.

What is claimed is:

1. A super-junction trench MOSFET with resurf stepped oxide, comprising:
    a substrate of a first conductivity type;
    an epitaxial layer of said first conductivity type onto said substrate, said epitaxial layer having a lower doping concentration than said substrate;
    a plurality of trenches starting from an upper surface of said epitaxial layer and extending downward into said epitaxial layer;
    a first insulation layer along an inner surface of a lower portion of each of said trenches;
    a second insulation layer along an inner surface of an upper portion of each of said trenches, said second insulation layer having a thinner thickness than said first insulation layer;
    a single gate electrode within each of said trenches, surrounded by said first insulation layer and said second insulation layer;
    a plurality of first doped column regions of said first conductivity type formed adjacent to sidewalls of said trenches;
    a plurality of second doped column regions of a second conductivity type formed in parallel and surrounded with said first doped column regions;
    a plurality of body regions of said second conductivity type formed adjacent to sidewalls of the upper portion of said trenches and onto a top surface of said first doped column regions and said second doped column regions between two adjacent of said trenches;
    a plurality of source regions of said first conductivity type formed near top surfaces of said body regions in an active area and adjacent to sidewalls of said upper portion of said trenches;
    a plurality of trenched source-body contacts each filled with a contact metal plug and penetrating through said source regions, extending into said body regions;
    a plurality of body contact doped regions of said second conductivity type within said body regions and surrounding at least bottoms of said trenched source-body contacts underneath said source regions, wherein said body contact doped regions have a higher doping concentration than said body regions.

2. The super-junction trench MOSFET of claim 1, wherein trench bottoms of said trenches are above said substrate.

3. The super-junction trench MOSFET of claim 1, wherein each of said trenches further extends into said substrate.

4. The super-junction trench MOSFET of claim 1, wherein said first doped column regions have column bottoms above trench bottoms of said trenches.

5. The super-junction trench MOSFET of claim 1 further comprising a guard ring of said second conductivity type having a junction depth greater than said body regions in a termination area.

6. The super-junction trench MOSFET of claim 1 further comprising a guard ring connected with said source regions, and multiple floating guard rings having floating voltage in a termination area wherein said guard ring and said multiple floating guard rings have second conductivity type, and have junction depths deeper than said body regions.

7. The super-junction trench MOSFET of claim 1 further comprising multiple floating body regions having floating voltage in a termination area wherein said multiple floating body regions having same conductivity type and junction depths as said body regions are formed simultaneously as said body regions.

8. The super-junction trench MOSFET of claim 1, wherein said contact metal plug is a tungsten layer padded by a barrier metal layer of Ti/TiN or Co/TiN.

9. The super-junction trench MOSFET of claim 8 further comprising an Al alloys layer overlying a Ti or Ti/TiN layer as said source metal onto a contact interlayer and said contact metal plug.

10. The super-junction trench MOSFET of claim 1, wherein said contact metal plug is a source metal composed of an Al alloys layer padded by a barrier metal layer of Ti/TiN or Co/TiN.

11. The super-junction trench MOSFET of claim 1, wherein the source regions have a uniform doping concentration and junction depth between sidewalls of said trenched source-body contacts to adjacent channel regions near said trenches.

12. The super-junction trench MOSFET of claim 1, wherein said source regions have a higher doping concentration and a greater junction depth along sidewalls of said trenched source-body contacts than along adjacent channel regions near said trenches, and said source regions have a Gaussian-distribution doping profile from the sidewalls of said trenched source-body contacts to said adjacent channel regions.

13. A super-junction trench MOSFET with resurf stepped oxides, comprising:
- a substrate of a first conductivity type;
- an epitaxial layer of said first conductivity type onto said substrate, said epitaxial layer having a lower doping concentration than said substrate;
- a plurality of trenches starting from an upper surface of said epitaxial layer and extending downward into said epitaxial layer;
- a first insulation layer along an inner surface of a lower portion of each of said trenches;
- a source electrode formed within said lower portion of each of said trenches and surrounded by said first insulation layer;
- a second insulation layer along an inner surface of an upper portion of each of said trenches and covering a top surface of said first insulation layer and said source electrode, said second insulation layer having a thinner thickness than said first insulation layer;
- a gate electrode formed within said upper portion of each of said trenches and surrounded by said second insulation layer;
- a plurality of first doped column regions of said first conductivity type formed adjacent to sidewalls of said trenches;
- a plurality of second doped column regions of a second conductivity type formed in parallel and surrounded with said first doped column regions;
- a plurality of body regions of said second conductivity type formed adjacent to sidewalls of said upper portion of said trenches and onto a top surface of said first doped column regions and said second doped column regions between two adjacent of said trenches;
- a plurality of source regions of said first conductivity type formed near top surfaces of said body regions in an active area and adjacent to sidewalls of said upper portion of said trenches;
- a plurality of trenched source-body contacts each filled with a contact metal plug, penetrating through said source regions and extending into said body regions;
- a plurality of body contact doped regions of said second conductivity type within said body regions and surrounding at least bottoms of said trenched source-body contacts underneath said source regions, wherein said body contact doped regions have a higher doping concentration than said body regions.

14. The super-junction trench MOSFET of claim 13, wherein trench bottoms of said trenches are above said substrate.

15. The super-junction trench MOSFET of claim 13, wherein each of said trenches further extends into said substrate.

16. The super-junction trench MOSFET of claim 13, wherein said first doped column regions have column bottoms above trench bottoms of said trenches.

17. The super-junction trench MOSFET of claim 13 further comprising a guard ring of said second conductivity type having a junction depth deeper than said body regions in a termination area.

18. The super-junction trench MOSFET of claim 13 further comprising a guard ring connected with said source regions, and multiple floating guard rings having floating voltage in a termination area wherein said guard ring and said multiple floating guard rings have said second conductivity type, and have junction depths greater than said body regions.

19. The super-junction trench MOSFET of claim 13 further comprising multiple floating body regions having floating voltage in a termination area wherein said multiple floating body regions having same conductivity type and junction depths as said body regions are formed simultaneously as said body regions.

20. The super-junction trench MOSFET of claim 13, wherein said contact metal plug is a tungsten layer padded by a barrier metal layer of Ti/TiN or Co/TiN.

21. The super-junction trench MOSFET of claim 20 further comprising an Al alloys layer overlying a Ti or Ti/TiN layer as said source metal onto a contact interlayer and said contact metal plugs.

22. The super-junction trench MOSFET of claim 13, wherein said contact metal plug is a source metal composed of an Al alloys layer padded by a barrier metal layer of Ti/TiN or Co/TiN.

23. The super-junction trench MOSFET of claim 13, wherein the source regions have a uniform doping concentration and junction depth between sidewalls of said trenched source-body contacts to adjacent channel regions near said trenches.

24. The super-junction trench MOSFET of claim 13, wherein said source regions have a higher doping concentration and a greater junction depth along sidewalls of said trenched source-body contacts than along adjacent channel regions near said trenches, and said source regions have a Gaussian-distribution doping profile from the sidewalls of said trenched source-body contacts to said adjacent channel regions.

* * * * *